US012724152B2

(12) United States Patent
Takatsuka

(10) Patent No.: US 12,724,152 B2
(45) Date of Patent: Sep. 1, 2026

(54) PHOTODETECTION DEVICE AND PHOTODETECTION SYSTEM

(71) Applicant: SONY SEMICONDUCTOR SOLUTIONS CORPORATION, Kanagawa (JP)

(72) Inventor: Takafumi Takatsuka, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 690 days.

(21) Appl. No.: 18/250,282

(22) PCT Filed: Sep. 16, 2021

(86) PCT No.: PCT/JP2021/034175
§ 371 (c)(1),
(2) Date: Apr. 24, 2023

(87) PCT Pub. No.: WO2022/091624
PCT Pub. Date: May 5, 2022

(65) Prior Publication Data

US 2023/0417921 A1 Dec. 28, 2023

(30) Foreign Application Priority Data

Nov. 2, 2020 (JP) ................................ 2020-183865

(51) Int. Cl.
*G01S 17/894* (2020.01)
*G01S 7/481* (2006.01)
(Continued)

(52) U.S. Cl.
CPC .......... *G01S 17/894* (2020.01); *G01S 7/4816* (2013.01); *G01S 7/4863* (2013.01); *G01S 7/4865* (2013.01);
(Continued)

(58) Field of Classification Search
CPC ...... G01S 17/10; G01S 17/894; G01S 17/931; G01S 7/4816; G01S 7/4863; G01S 7/4865; H10F 39/107
See application file for complete search history.

(56) References Cited

U.S. PATENT DOCUMENTS 10,785,423 B2 * 9/2020 Ikedo .................. H04N 25/773
2007/0182949 A1 8/2007 Niclass
(Continued)

FOREIGN PATENT DOCUMENTS

JP 2018-182051 A 11/2018
JP 2019-032305 A 2/2019
(Continued)

OTHER PUBLICATIONS

International Search Report and Written Opinion of PCT Application No. PCT/JP2021/034175, issued on Nov. 2, 2021, 08 pages of ISRWO.

*Primary Examiner* — Patrick O Neill
(74) *Attorney, Agent, or Firm* — CHIP LAW GROUP

(57) ABSTRACT

A photodetection device according to the present disclosure includes: a plurality of light-receiving sections that each includes a light-receiving element, and generates a first pulse signal including a pulse corresponding to a result of light reception by the light-receiving element; an adder that generates a second pulse signal by selecting one or more first pulse signals from a plurality of the first pulse signals generated by the plurality of light-receiving sections and performing addition processing on the basis of the one or more selected first pulse signals; a divider that performs division processing for dividing the second pulse signal into a plurality of third pulse signals in a time division manner on the basis of a clock signal; a plurality of counters that is provided corresponding to the plurality of third pulse signals, and each performs count processing on the basis of a
(Continued)

corresponding one of the third pulse signals; and a controller that sets signal number of the one or more pulse signals to be subjected to the addition processing on the basis of respective count values of the plurality of counters.

17 Claims, 29 Drawing Sheets

(51) Int. Cl.

| | |
|---|---|
| ***G01S 7/4863*** | (2020.01) |
| ***G01S 7/4865*** | (2020.01) |
| ***G01S 17/931*** | (2020.01) |
| ***H10F 39/10*** | (2025.01) |
| *G01S 17/10* | (2020.01) |

(52) U.S. Cl.
CPC .......... *G01S 17/931* (2020.01); *H10F 39/107* (2025.01); *G01S 17/10* (2013.01)

(56) References Cited

U.S. PATENT DOCUMENTS

| | | | | |
|---|---|---|---|---|
| 2008/0191139 | A1 | 8/2008 | Coello et al. | |
| 2020/0044109 | A1* | 2/2020 | Azuma | H10F 39/107 |
| 2020/0252563 | A1* | 8/2020 | Yasuda | H04N 25/704 |
| 2024/0111033 | A1* | 4/2024 | Ikeda | G01S 7/4863 |

FOREIGN PATENT DOCUMENTS

| | | |
|---|---|---|
| JP | 2020-091117 A | 6/2020 |
| JP | 2020-127122 A | 8/2020 |

* cited by examiner

[FIG. 1]
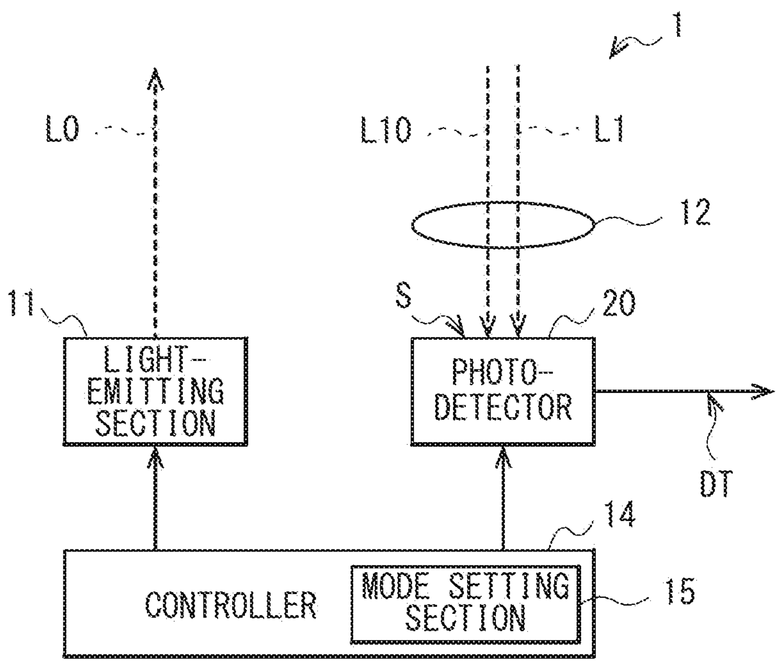
[FIG. 2]
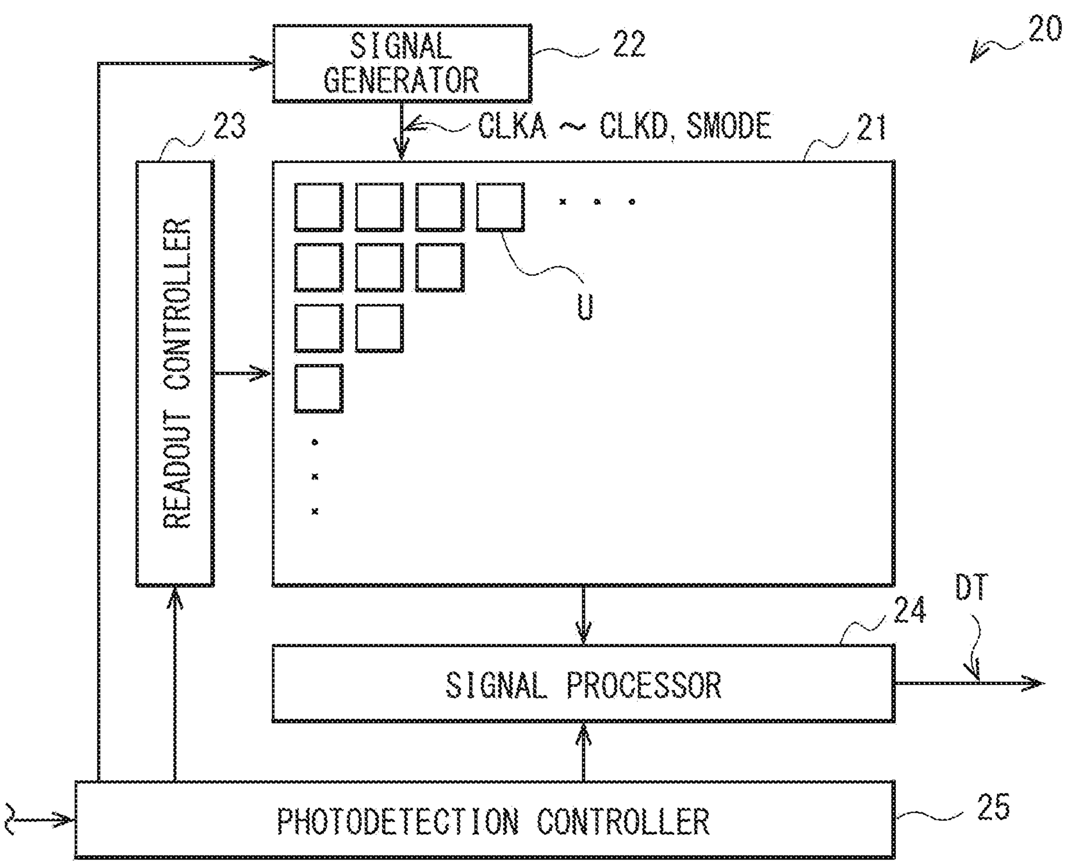

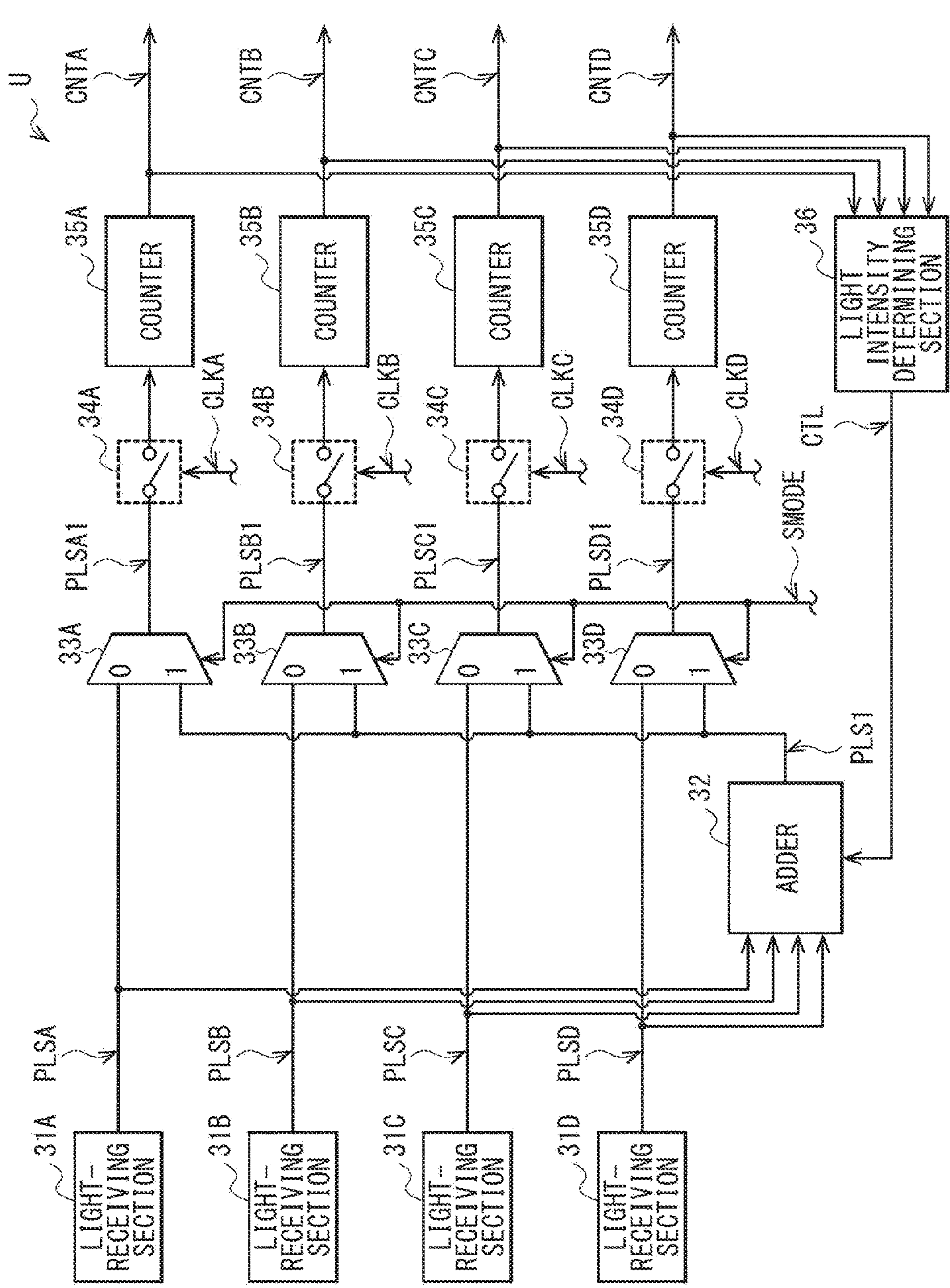
[FIG. 3]

[FIG. 4A]
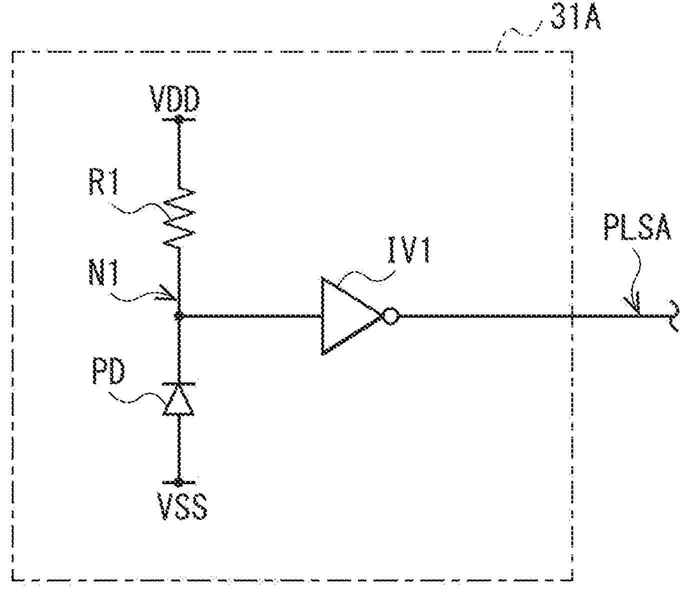
[FIG. 4B]
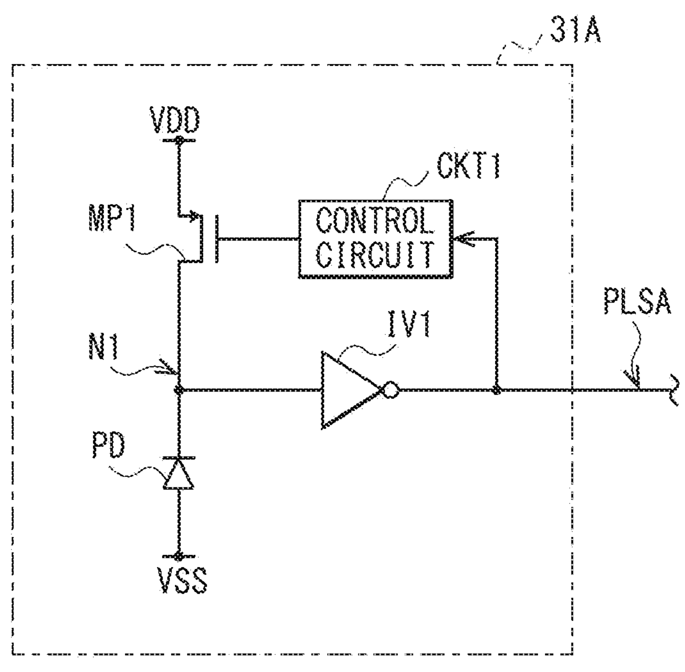

[FIG. 5]
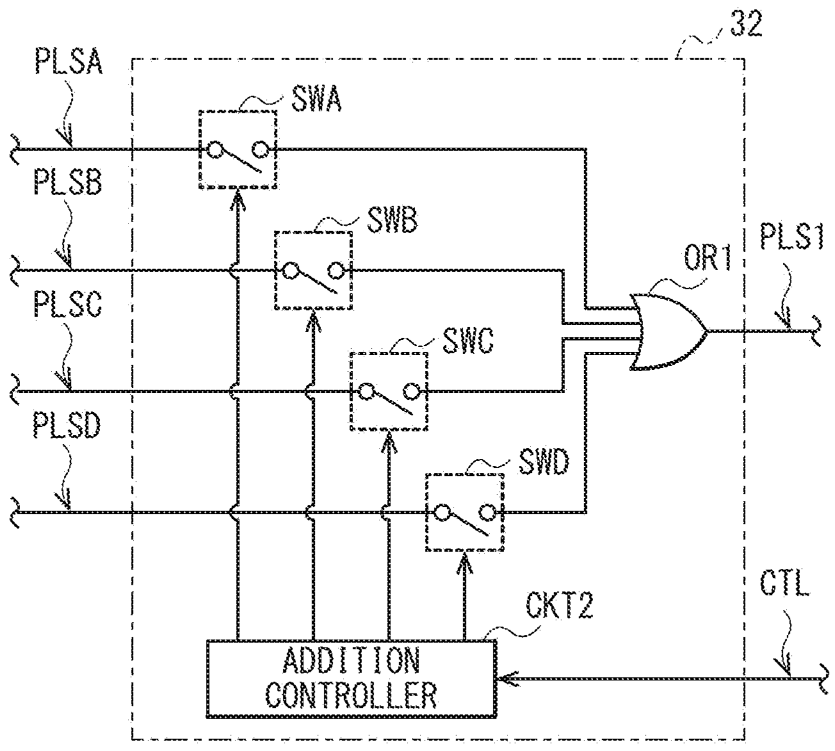
[FIG. 6A]
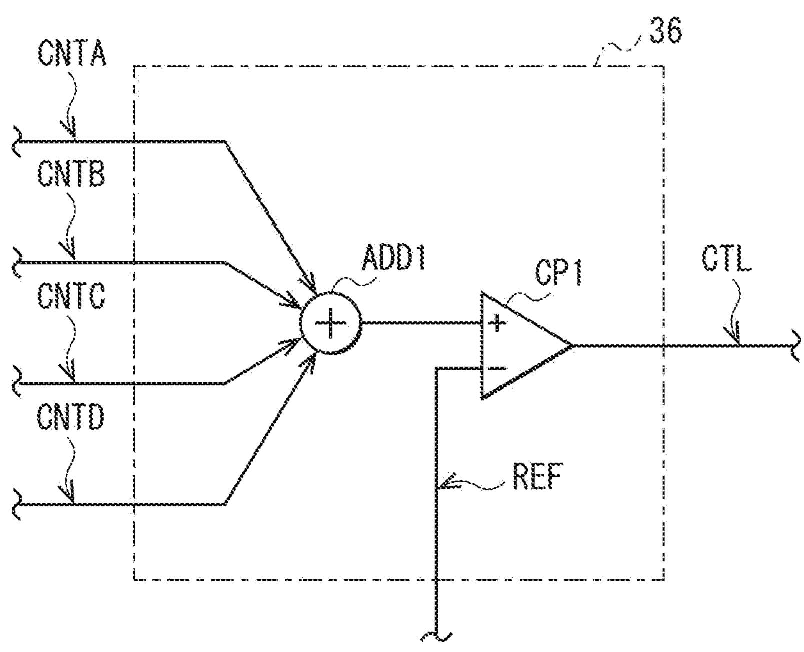

[FIG. 6B]
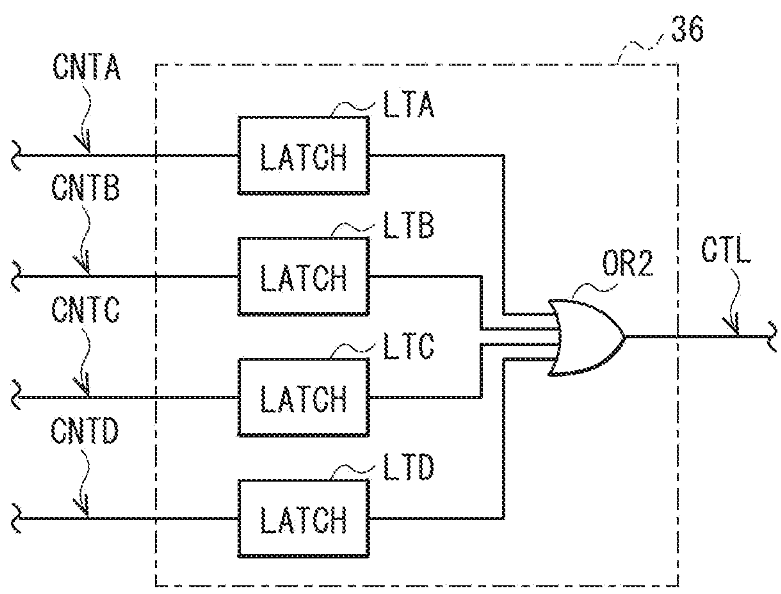
[FIG. 6C]
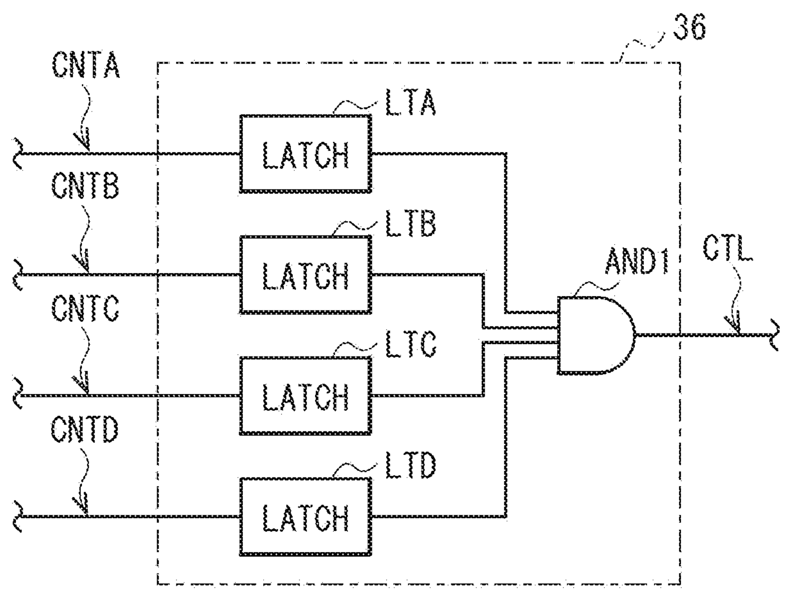

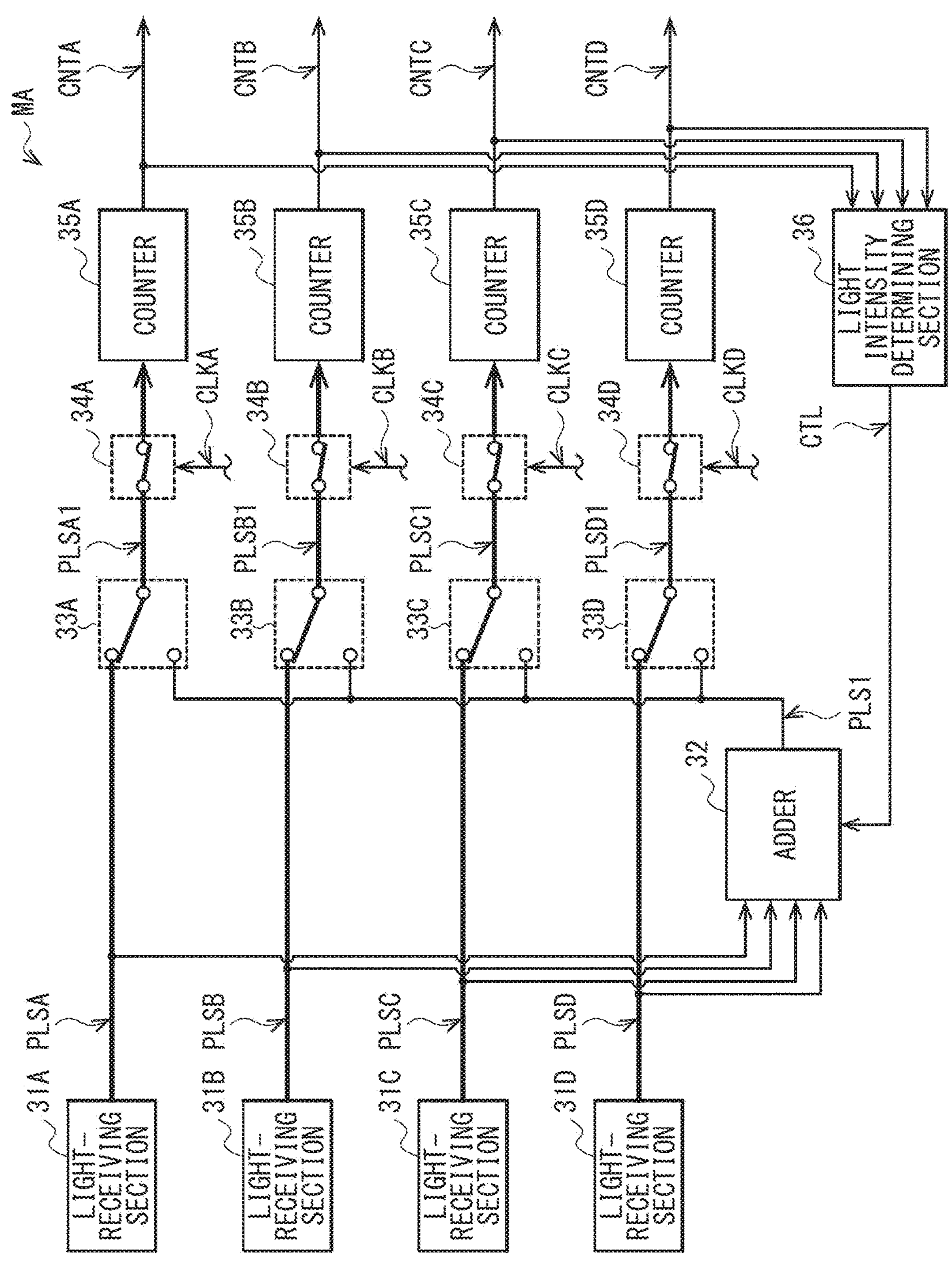
[FIG. 7]

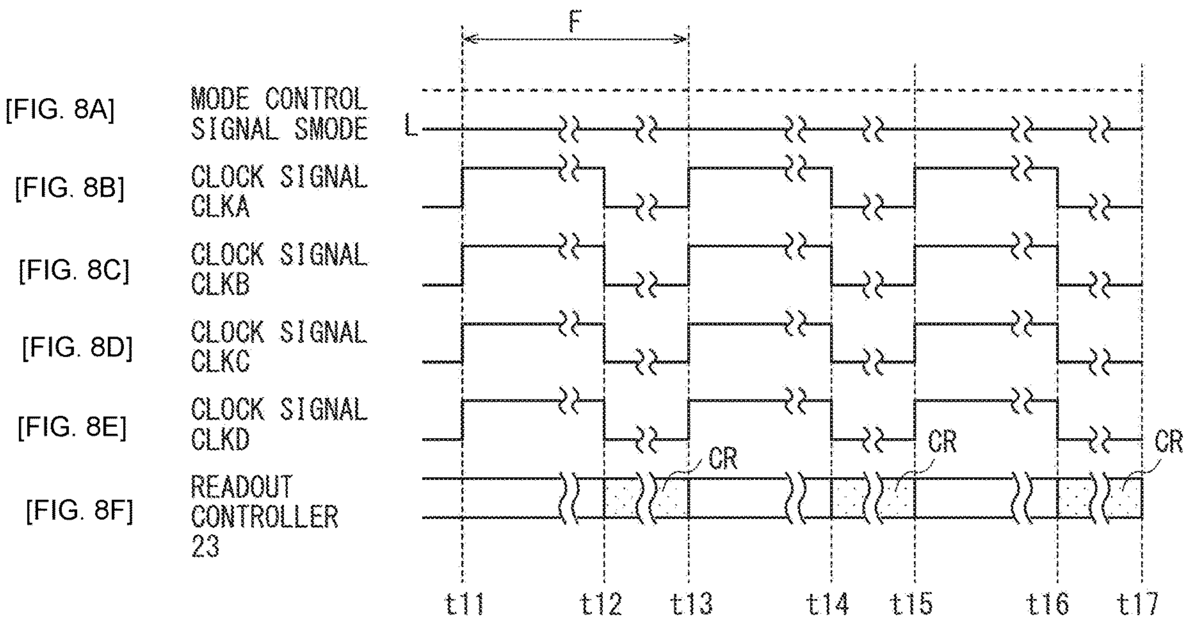
[FIG. 8A]
MODE CONTROL SIGNAL SMODE
L
[FIG. 8B]
CLOCK SIGNAL CLKA
[FIG. 8C]
CLOCK SIGNAL CLKB
[FIG. 8D]
CLOCK SIGNAL CLKC
[FIG. 8E]
CLOCK SIGNAL CLKD
[FIG. 8F]
READOUT CONTROLLER 23
F
CR
CR
CR
t11
t12
t13
t14
t15
t16
t17

[FIG. 9]
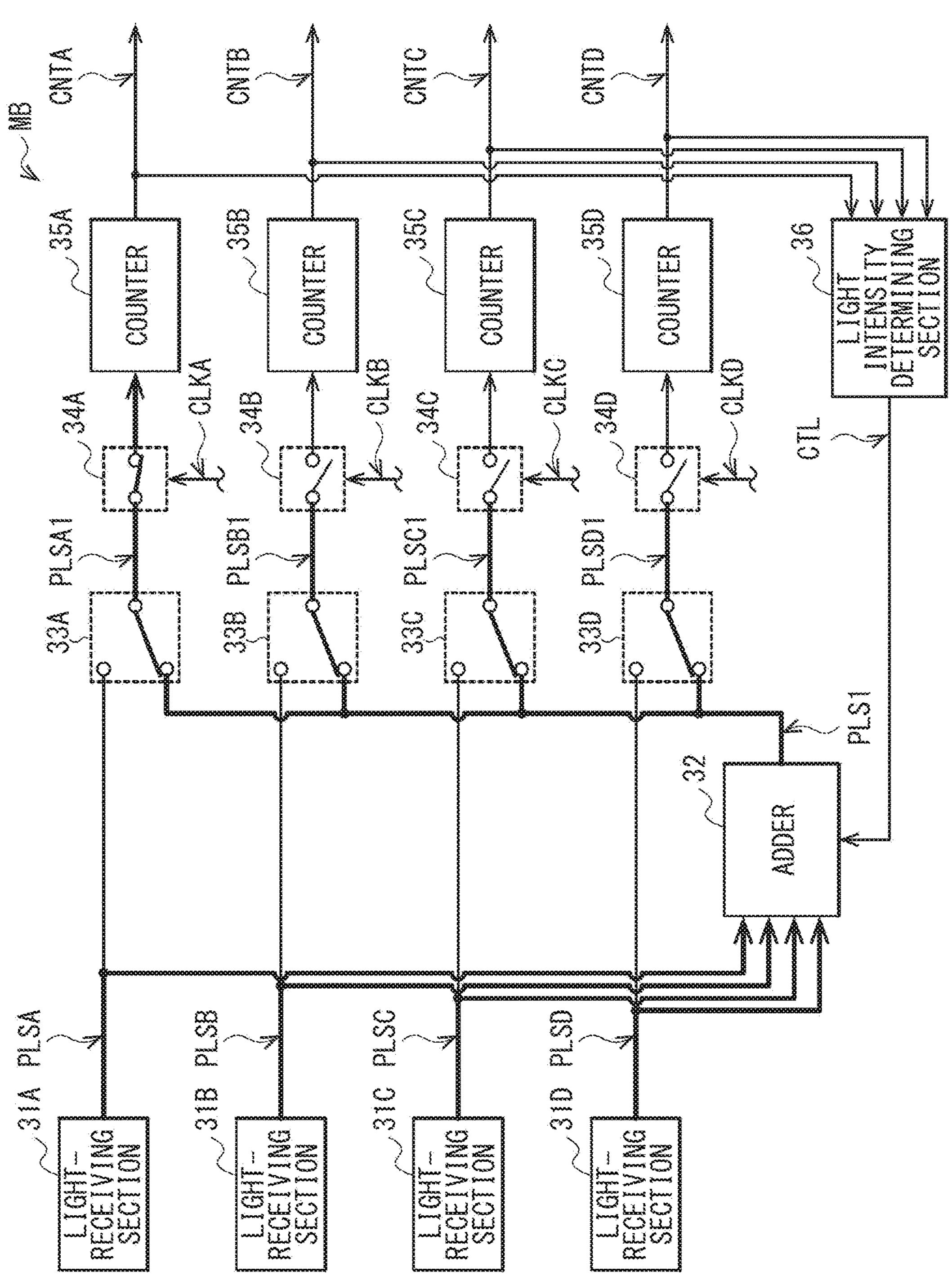

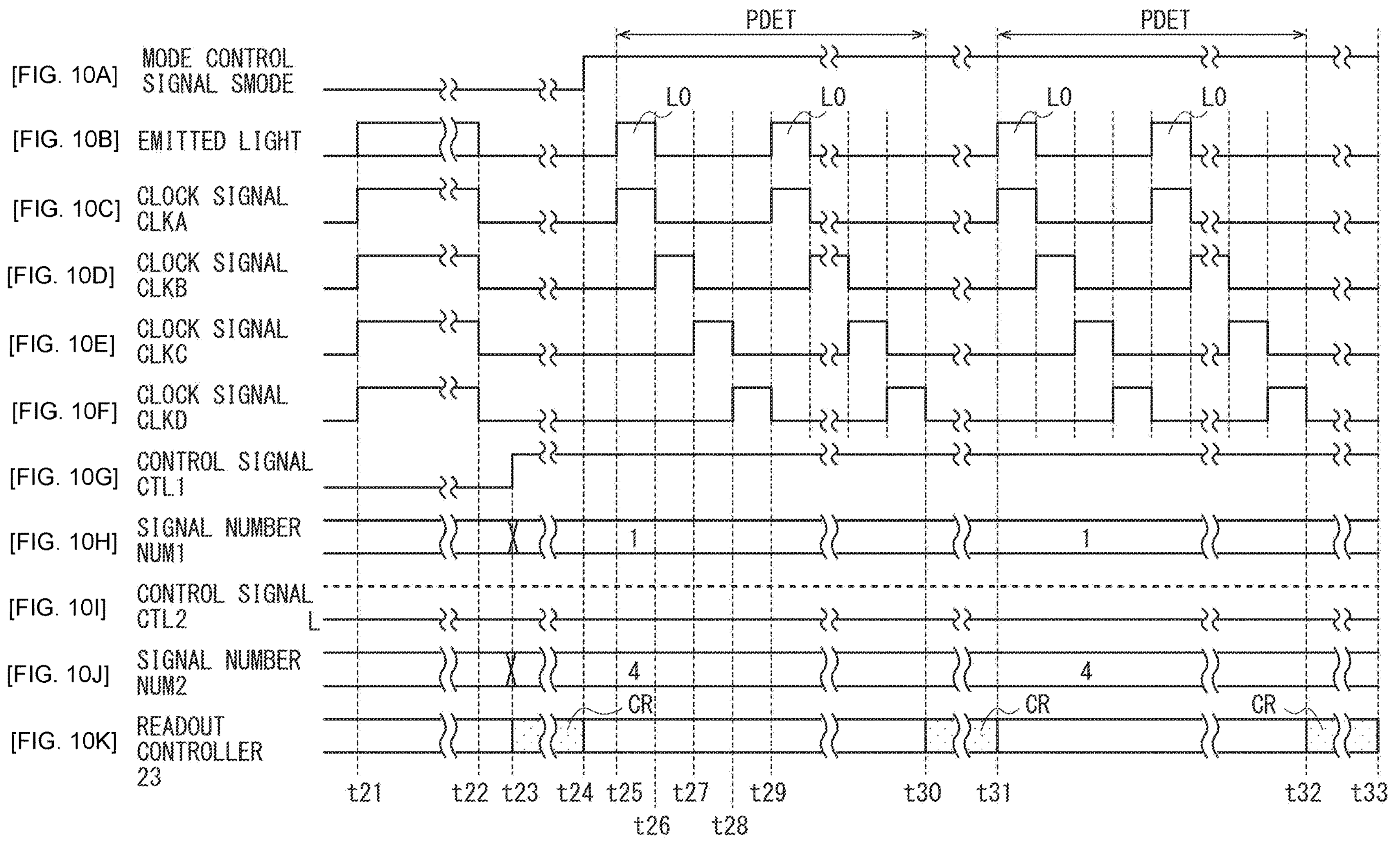
PDET
PDET
[FIG. 10A] MODE CONTROL SIGNAL SMODE
LO
LO
LO
LO
[FIG. 10B] EMITTED LIGHT
[FIG. 10C] CLOCK SIGNAL CLKA
[FIG. 10D] CLOCK SIGNAL CLKB
[FIG. 10E] CLOCK SIGNAL CLKC
[FIG. 10F] CLOCK SIGNAL CLKD
[FIG. 10G] CONTROL SIGNAL CTL1
[FIG. 10H] SIGNAL NUMBER NUM1
1
1
[FIG. 10I] CONTROL SIGNAL CTL2
L
[FIG. 10J] SIGNAL NUMBER NUM2
4
4
CR
CR
CR
[FIG. 10K] READOUT CONTROLLER 23
t21
t22
t23
t24
t25
t26
t27
t28
t29
t30
t31
t32
t33

[FIG. 11]
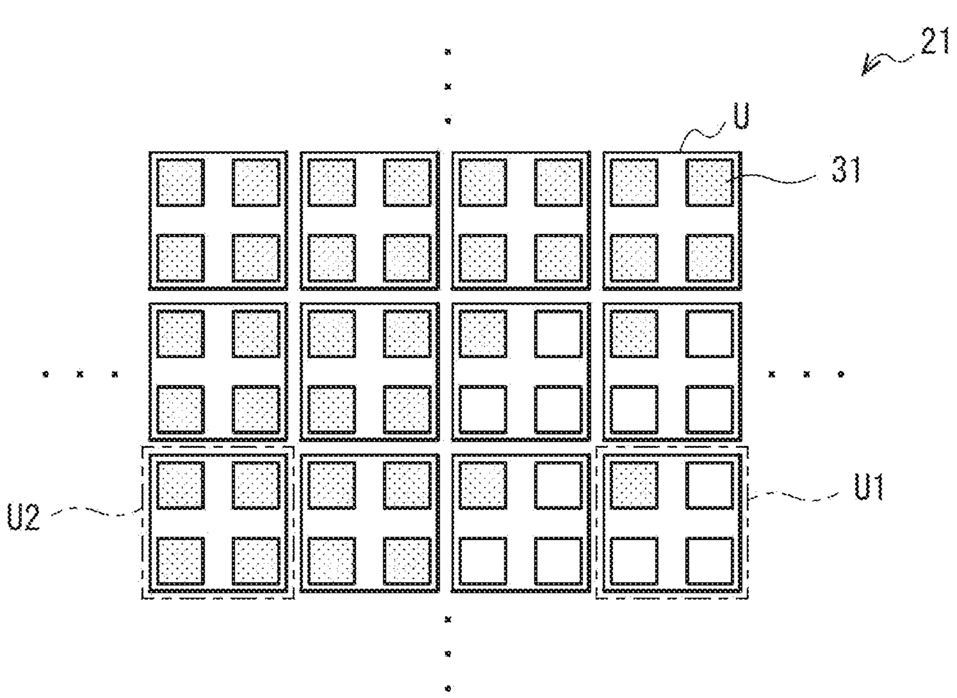

[FIG. 12]
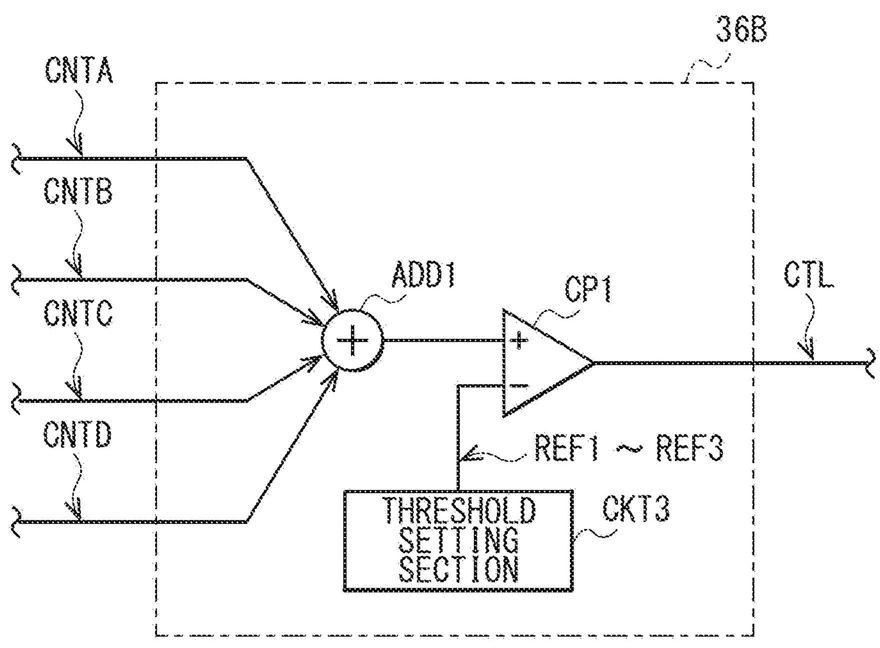
[FIG. 13]
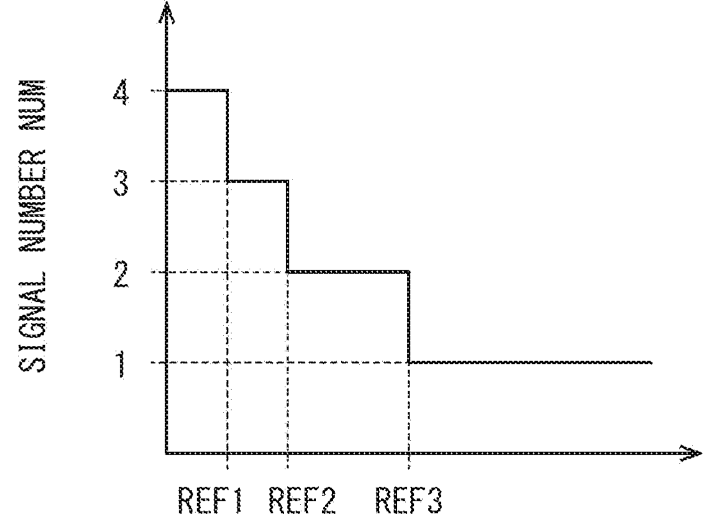

[FIG. 14]
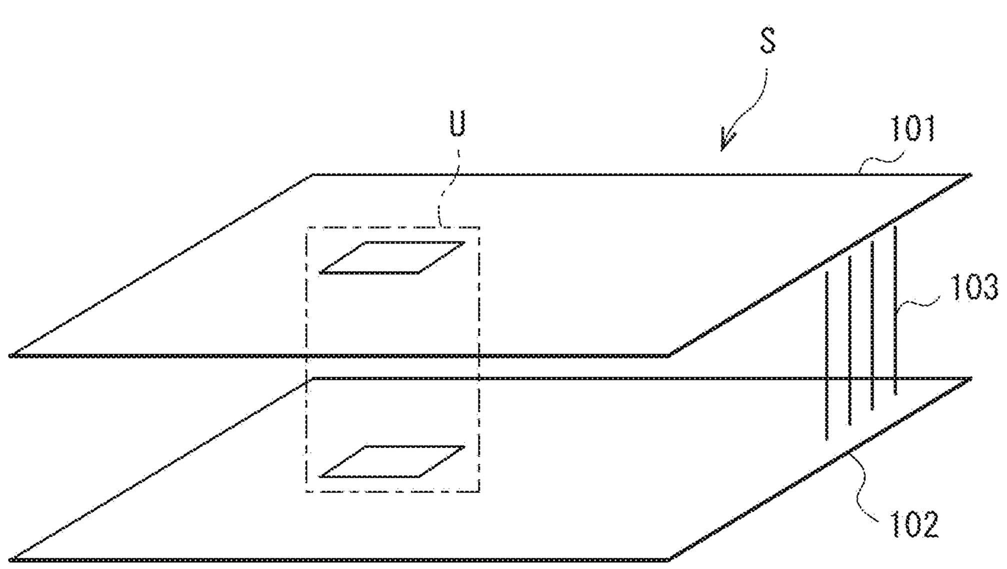

[FIG. 15A]
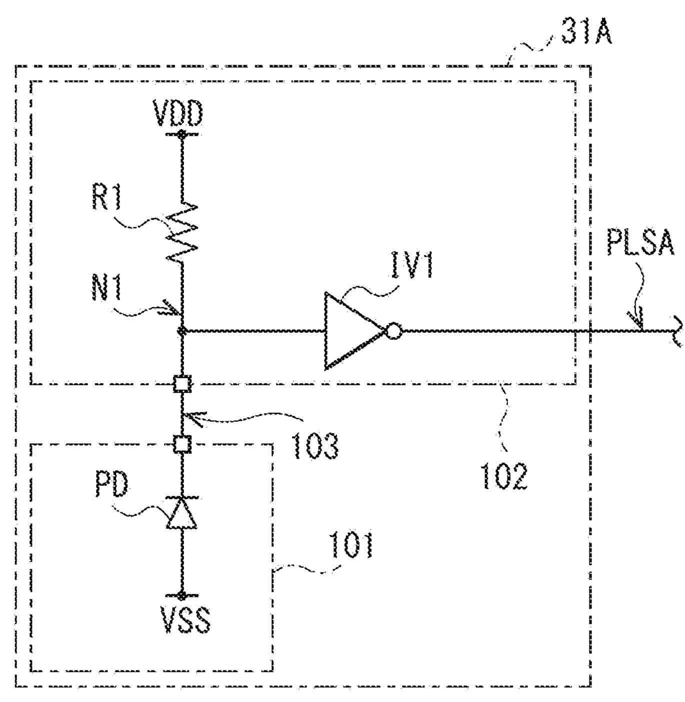
[FIG. 15B]
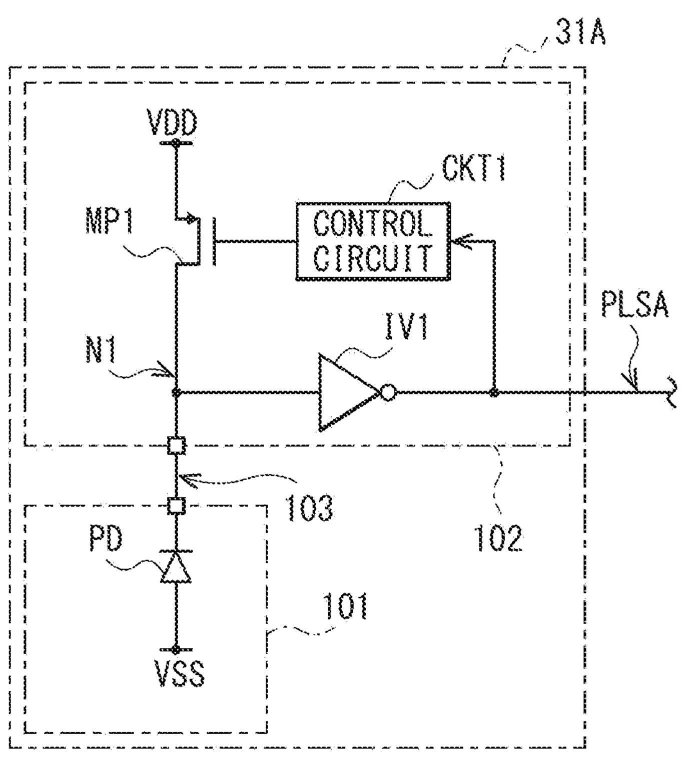

[FIG. 16]
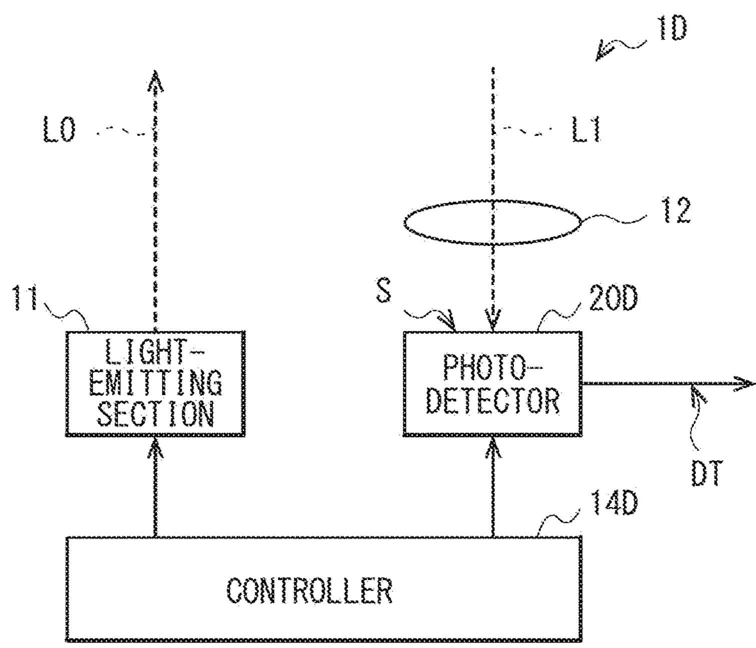
[FIG. 17]
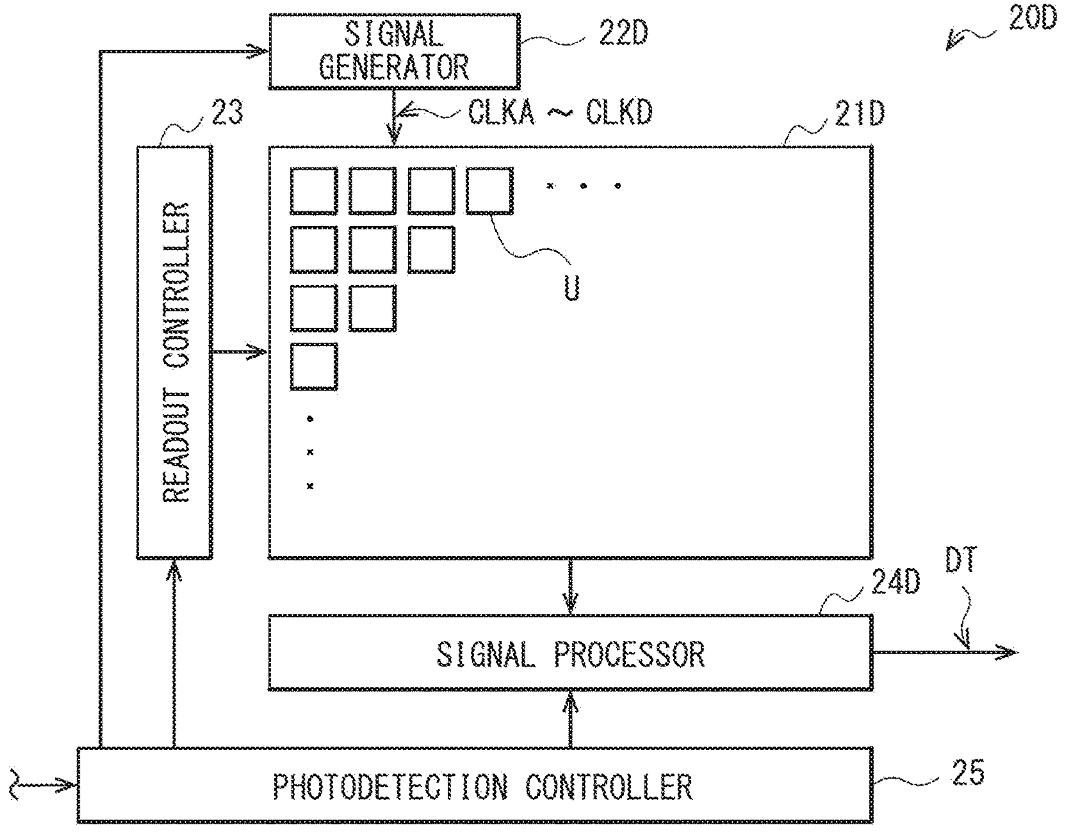

[FIG. 18]
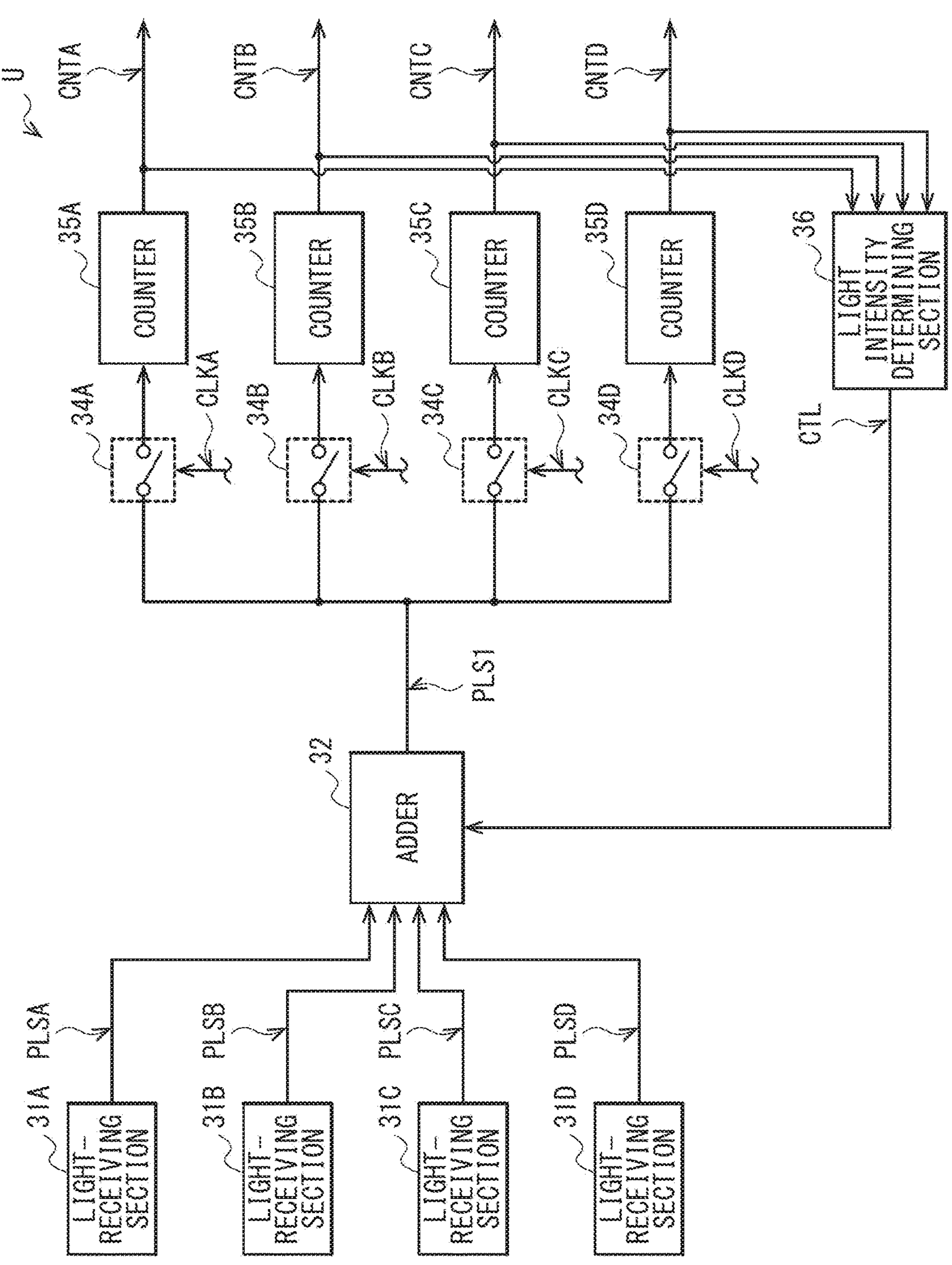

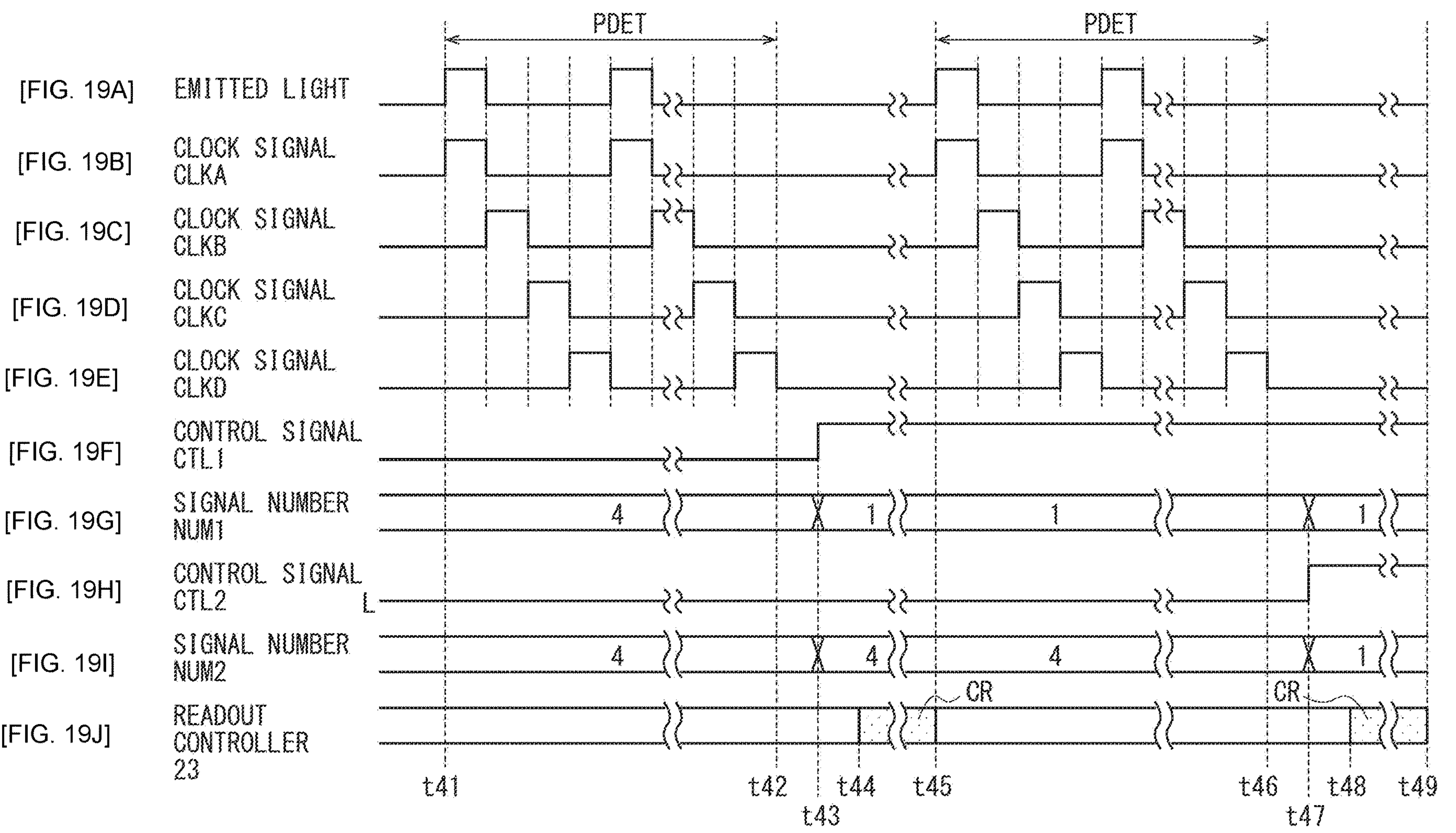
[FIG. 19A]
EMITTED LIGHT
[FIG. 19B]
CLOCK SIGNAL CLKA
[FIG. 19C]
CLOCK SIGNAL CLKB
[FIG. 19D]
CLOCK SIGNAL CLKC
[FIG. 19E]
CLOCK SIGNAL CLKD
[FIG. 19F]
CONTROL SIGNAL CTL1
[FIG. 19G]
SIGNAL NUMBER NUM1
[FIG. 19H]
CONTROL SIGNAL CTL2
L
[FIG. 19I]
SIGNAL NUMBER NUM2
[FIG. 19J]
READOUT CONTROLLER 23
PDET
PDET
4
1
1
1
4
4
4
1
CR
CR
t41
t42
t43
t44
t45
t46
t47
t48
t49

[FIG. 20]
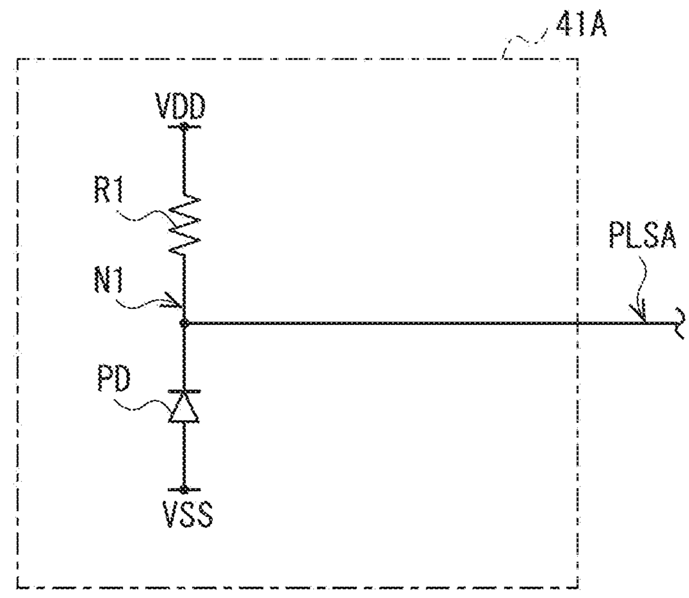
[FIG. 21]
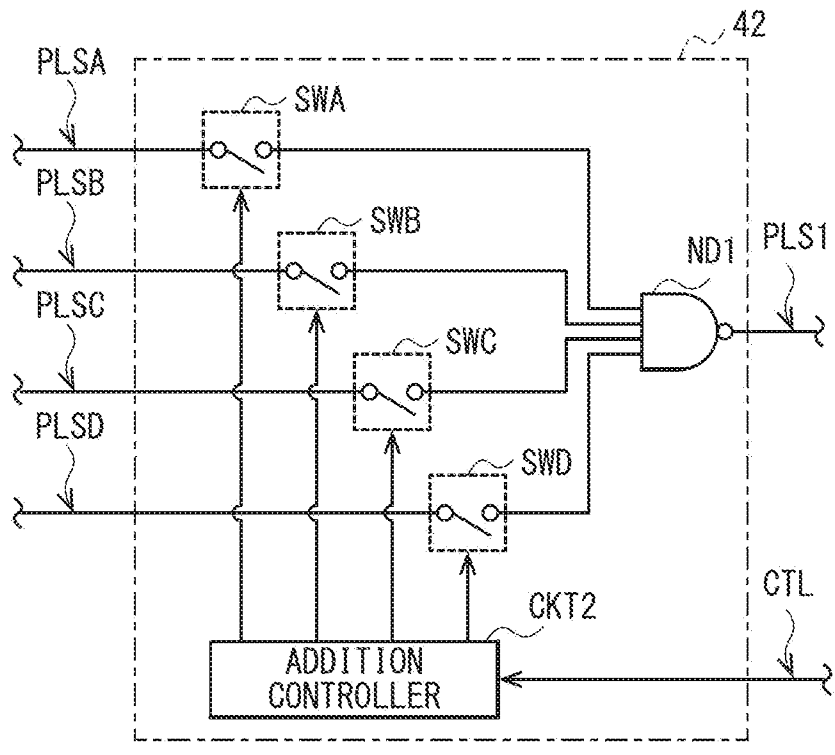

[FIG. 22A]
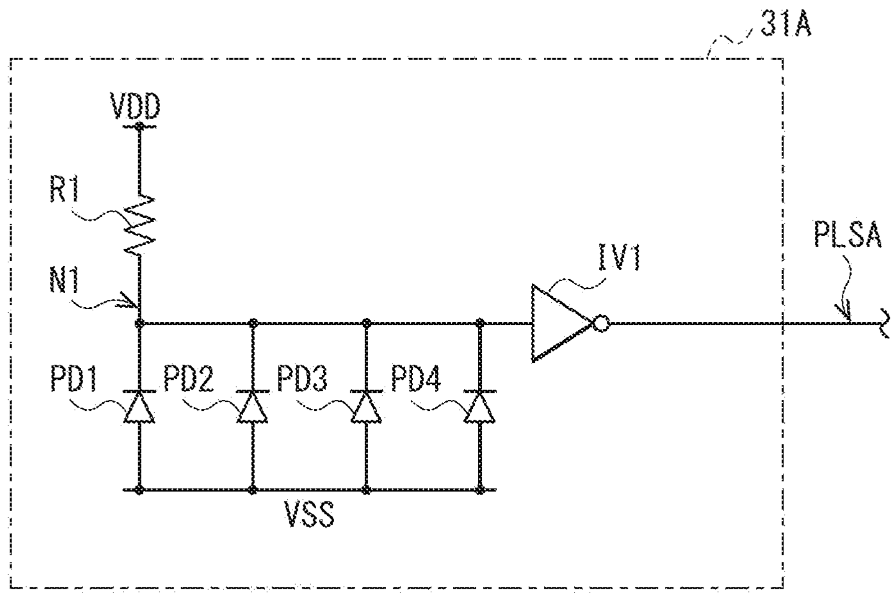
[FIG. 22B]
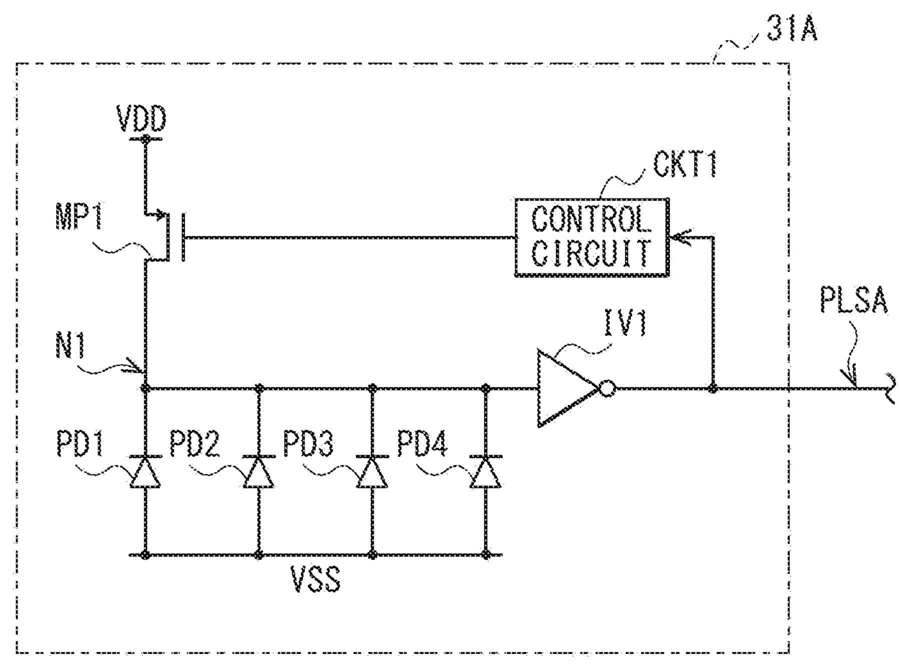

[FIG. 23]
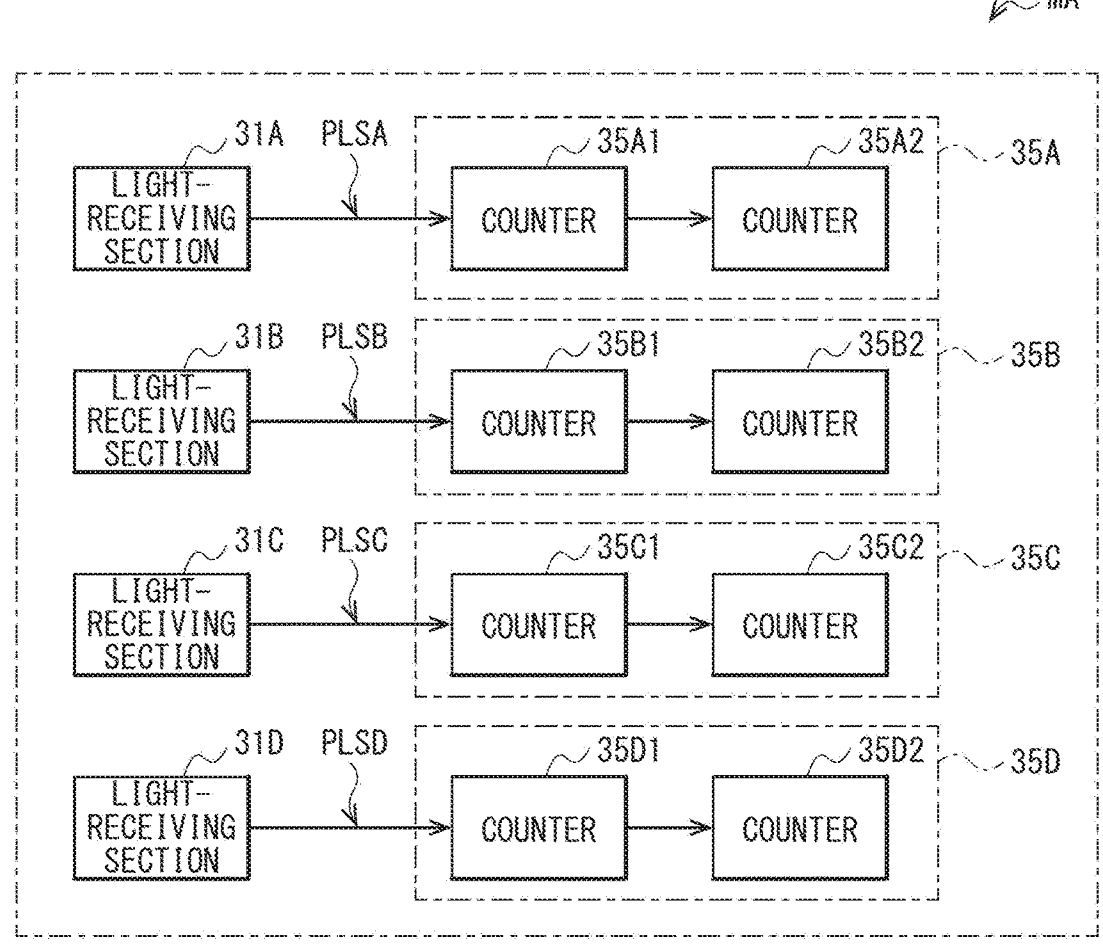

[FIG. 24]
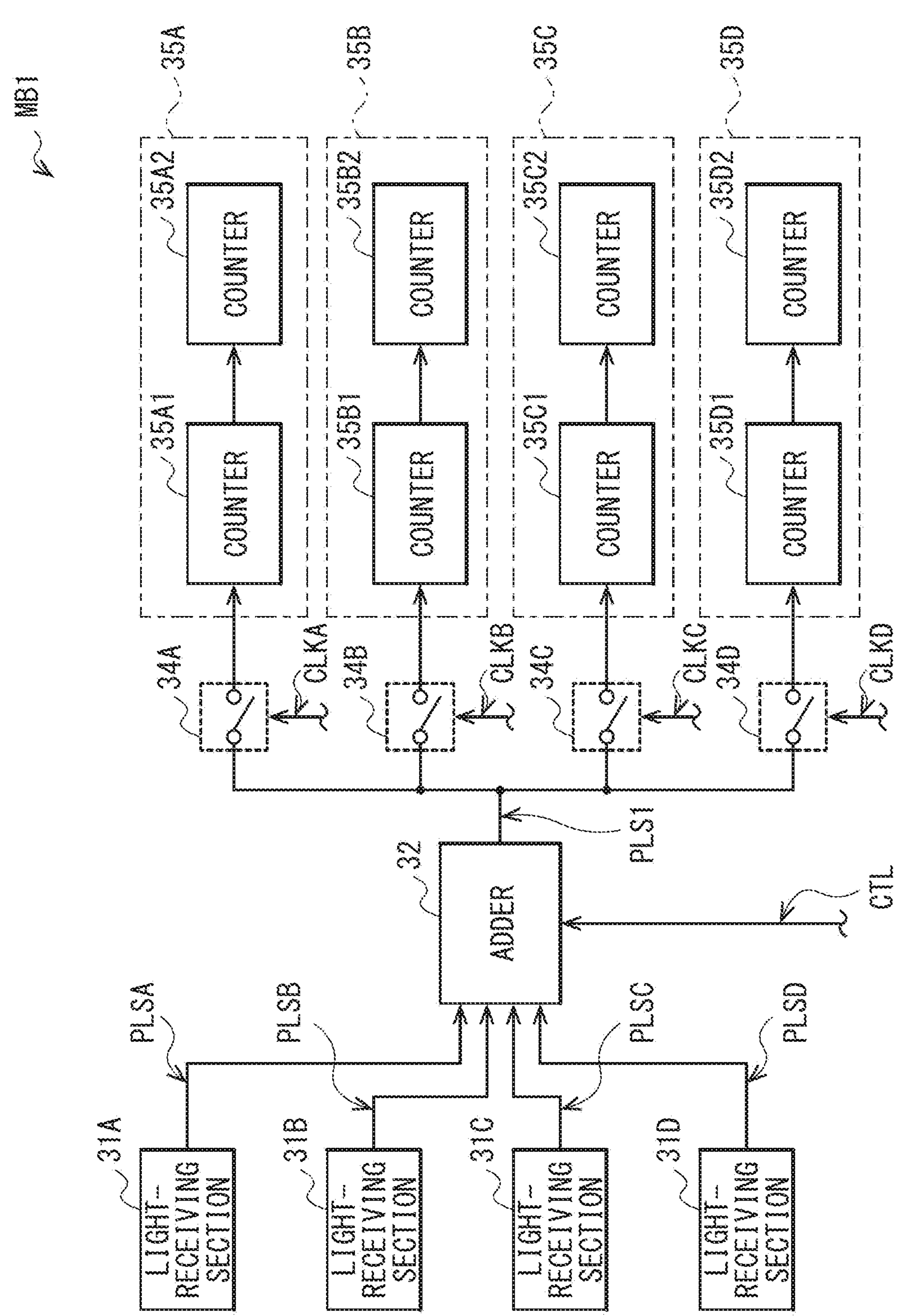

[FIG. 25]
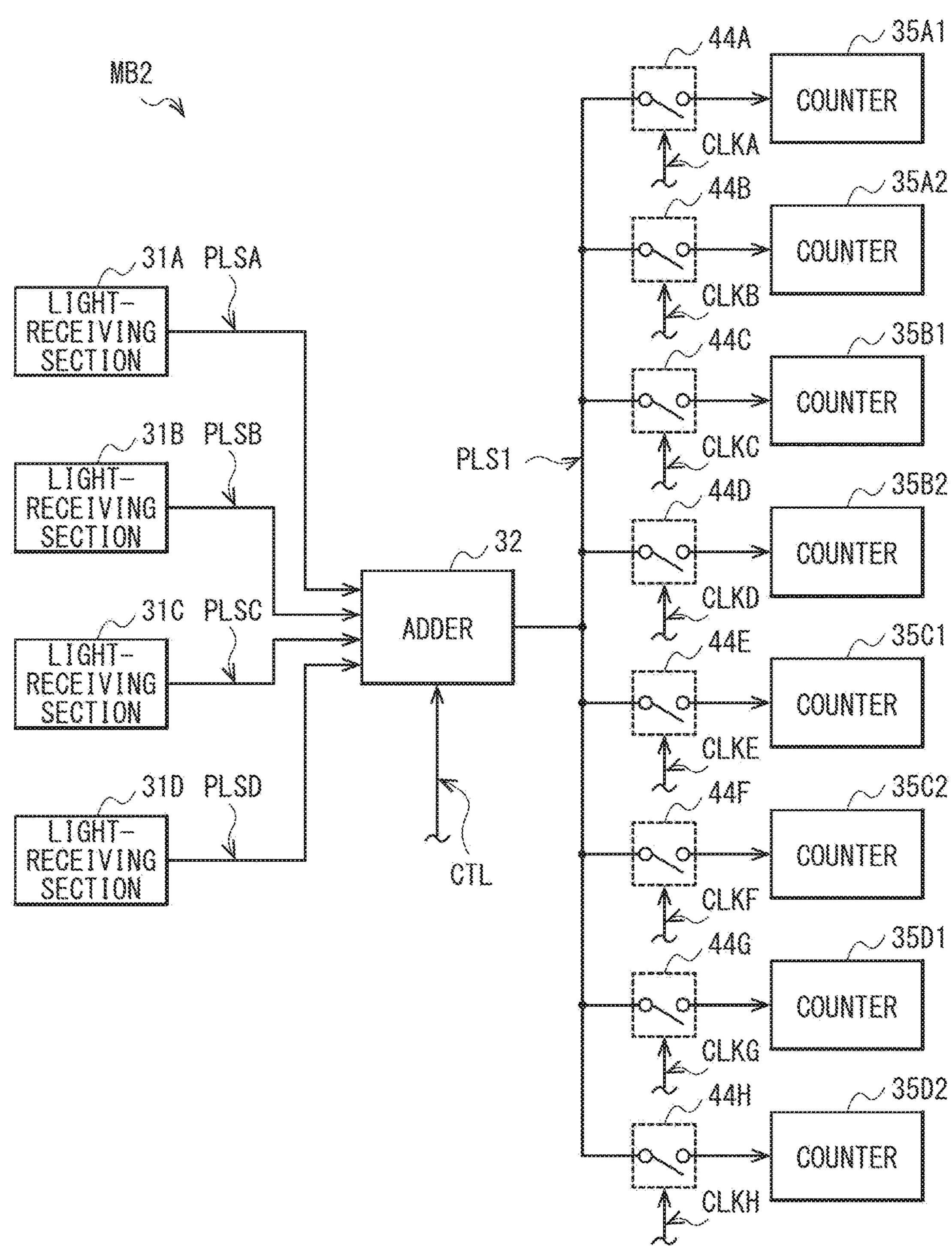

[FIG. 26]
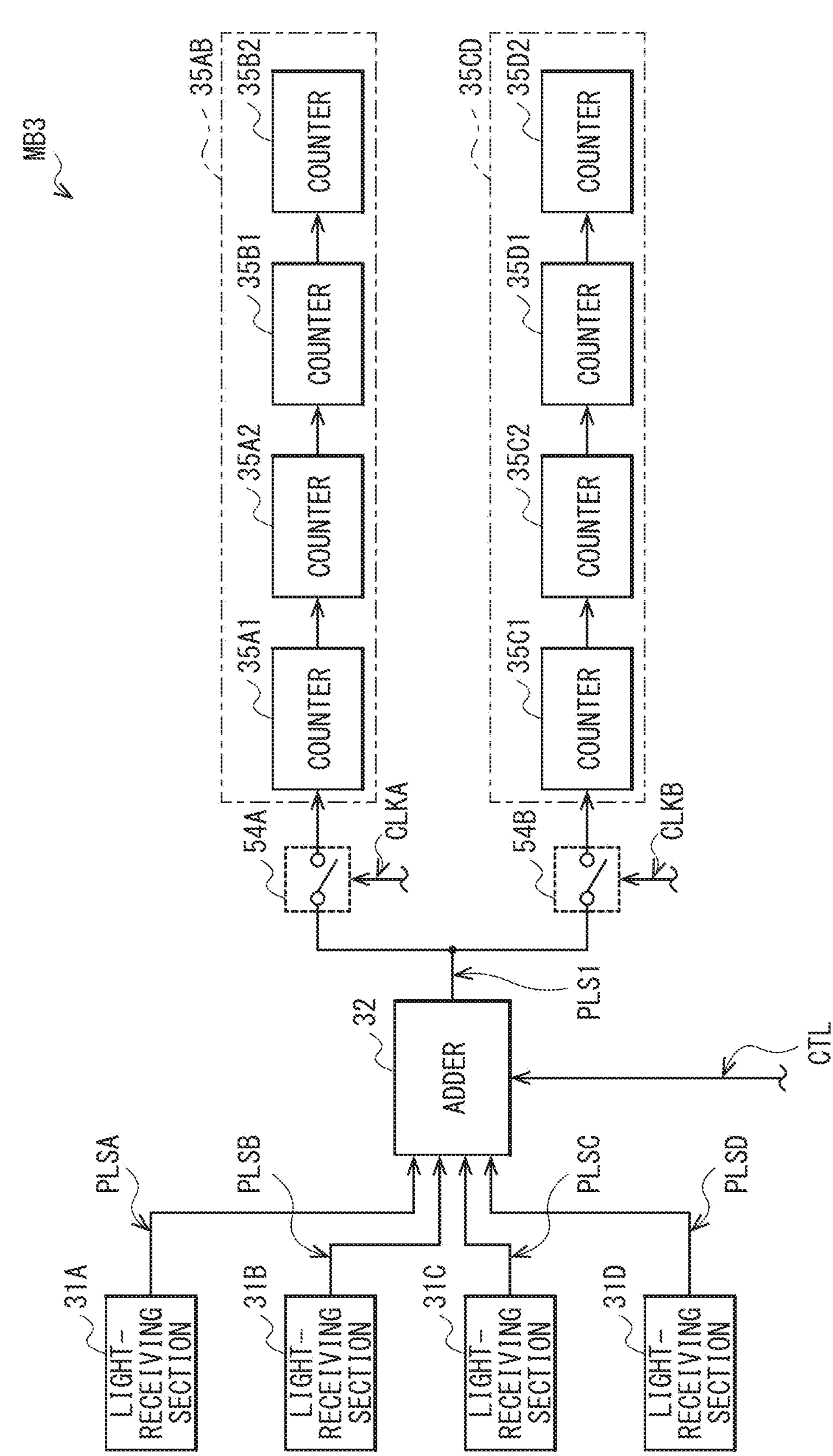

[FIG. 27]
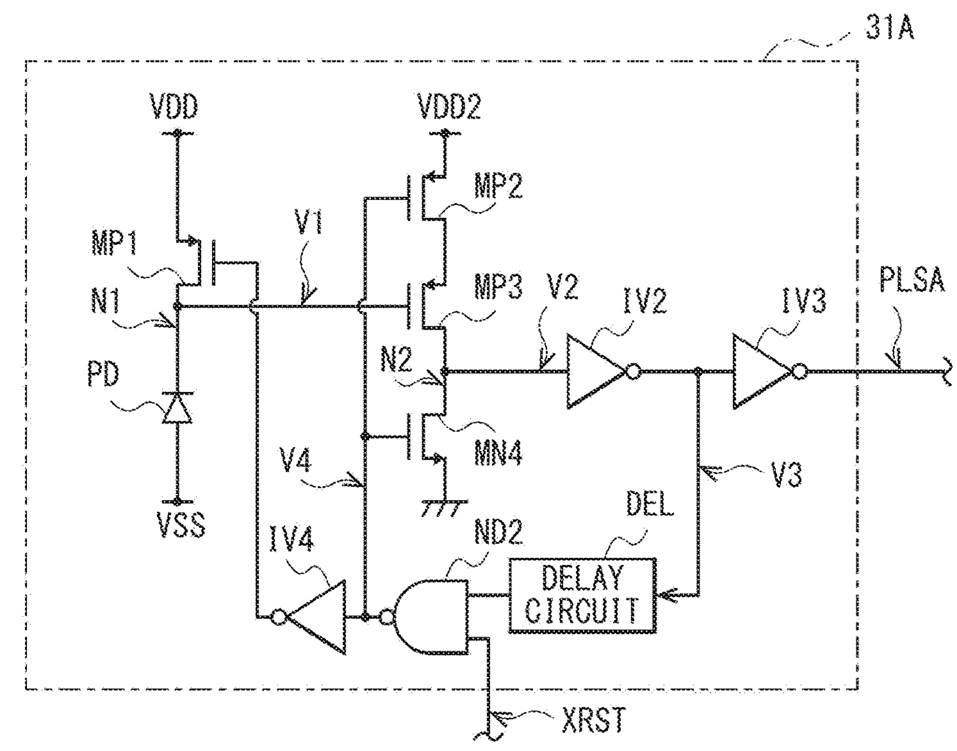
[FIG. 28A]
[FIG. 28B]
[FIG. 28C]
[FIG. 28D]
[FIG. 28E]
[FIG. 28F]
[FIG. 28G]
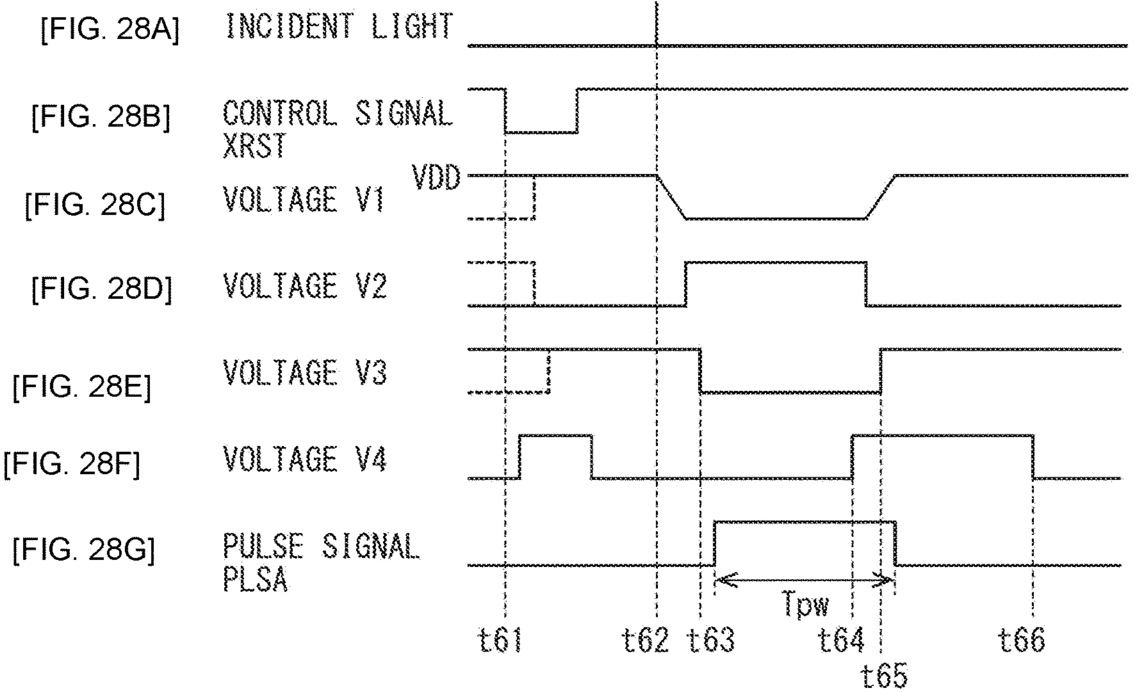

[FIG. 29]
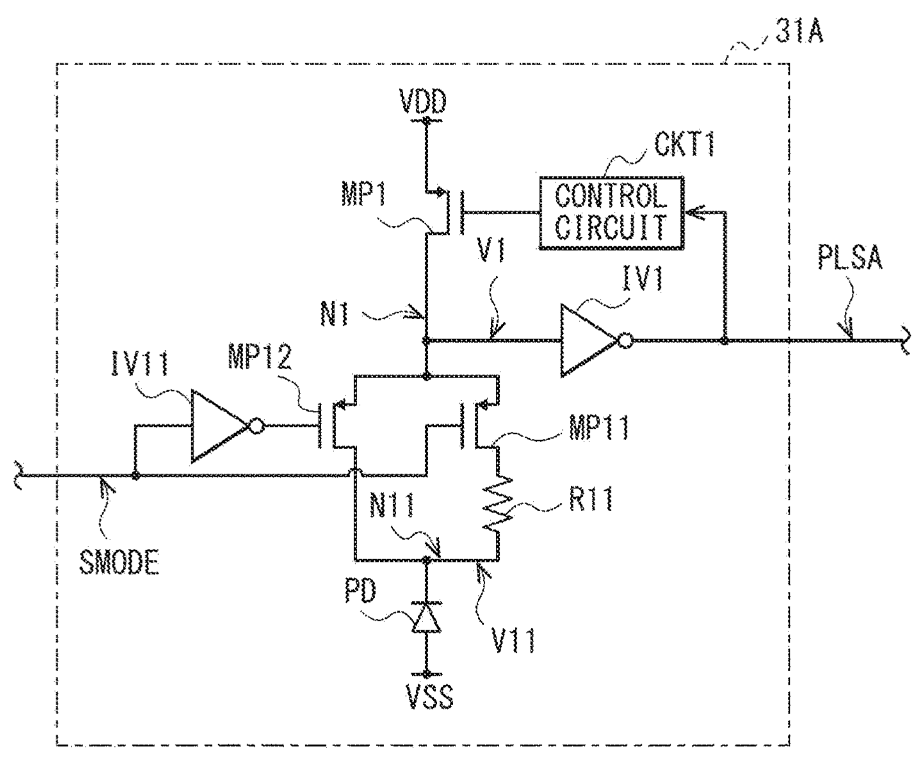
[FIG. 30A]
[FIG. 30B]
[FIG. 30C]
[FIG. 30D]
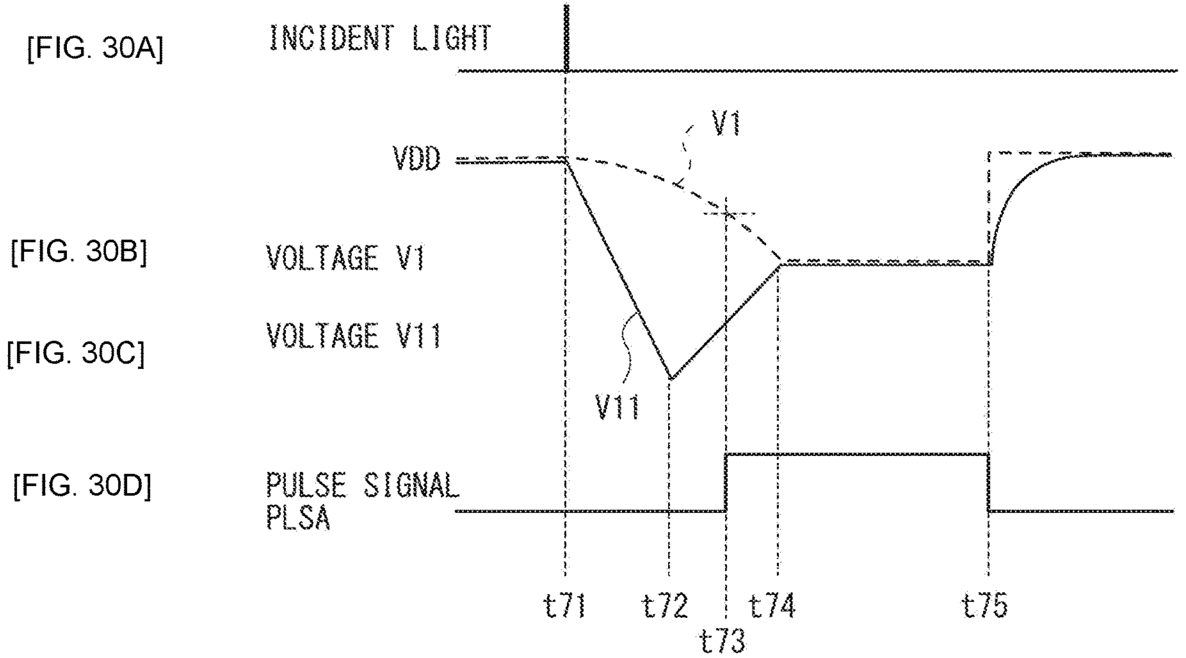

[FIG. 31]
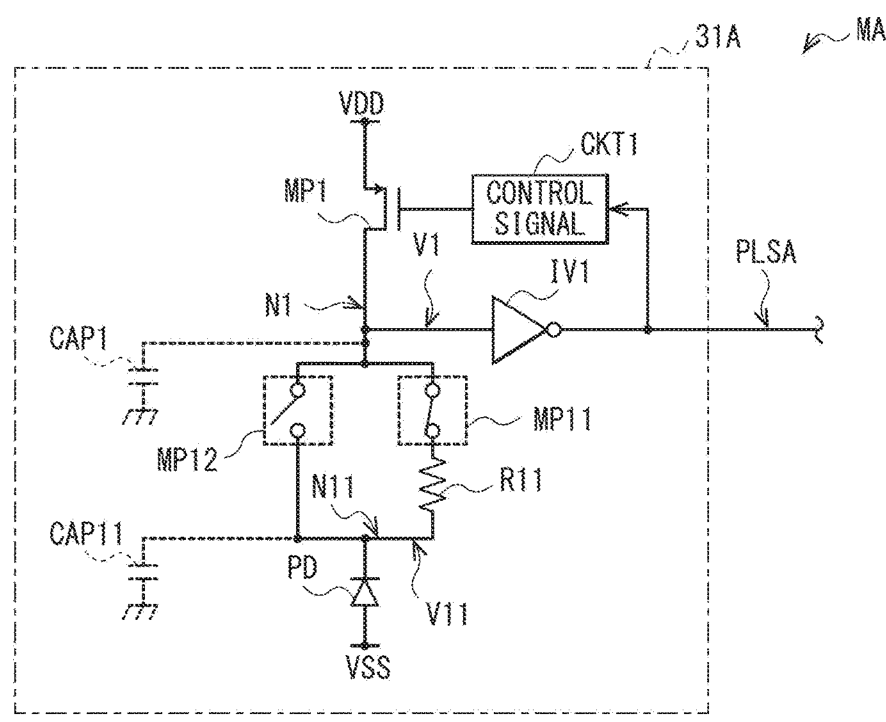
[FIG. 32A]
[FIG. 32B]
[FIG. 32C]
[FIG. 32D]
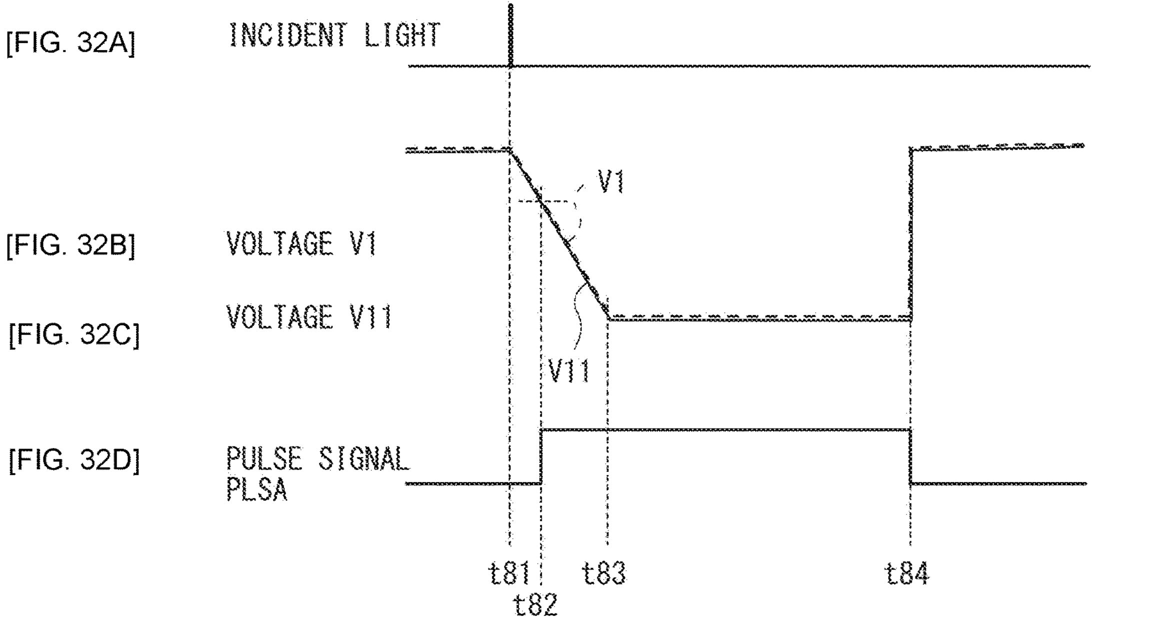

[FIG. 33]
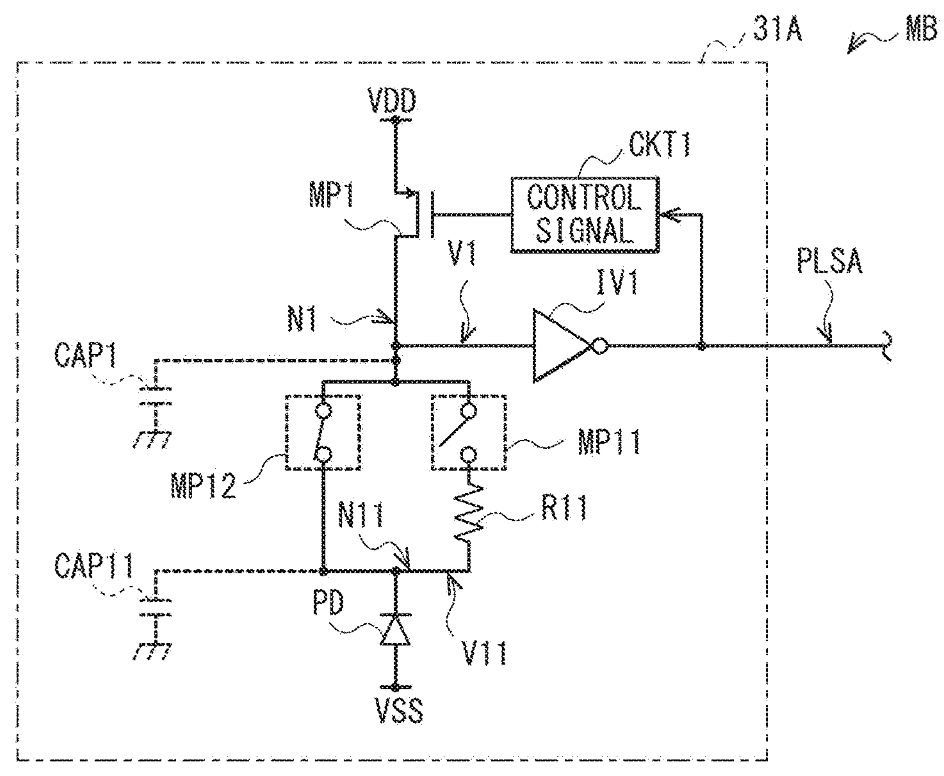
[FIG. 34]
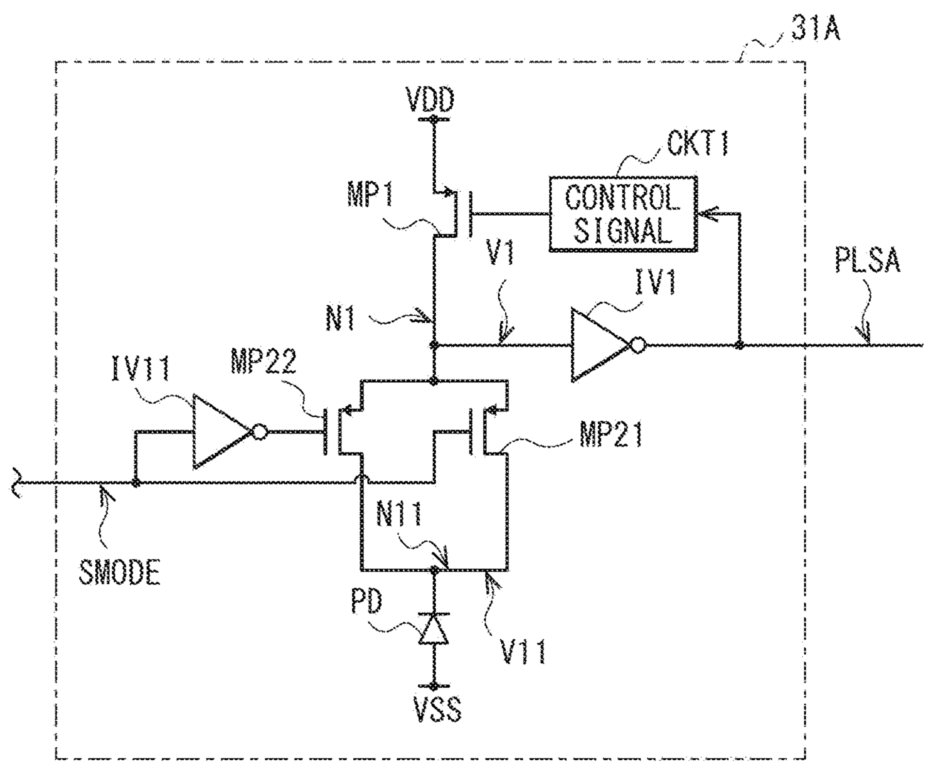

[FIG. 35]
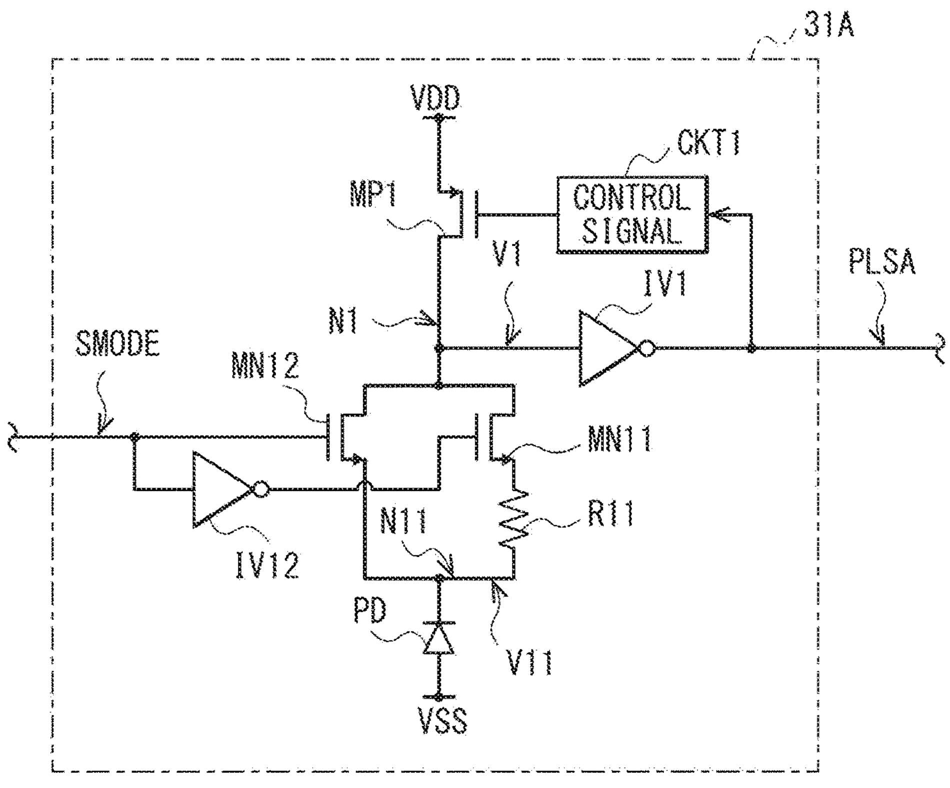
[FIG. 36]
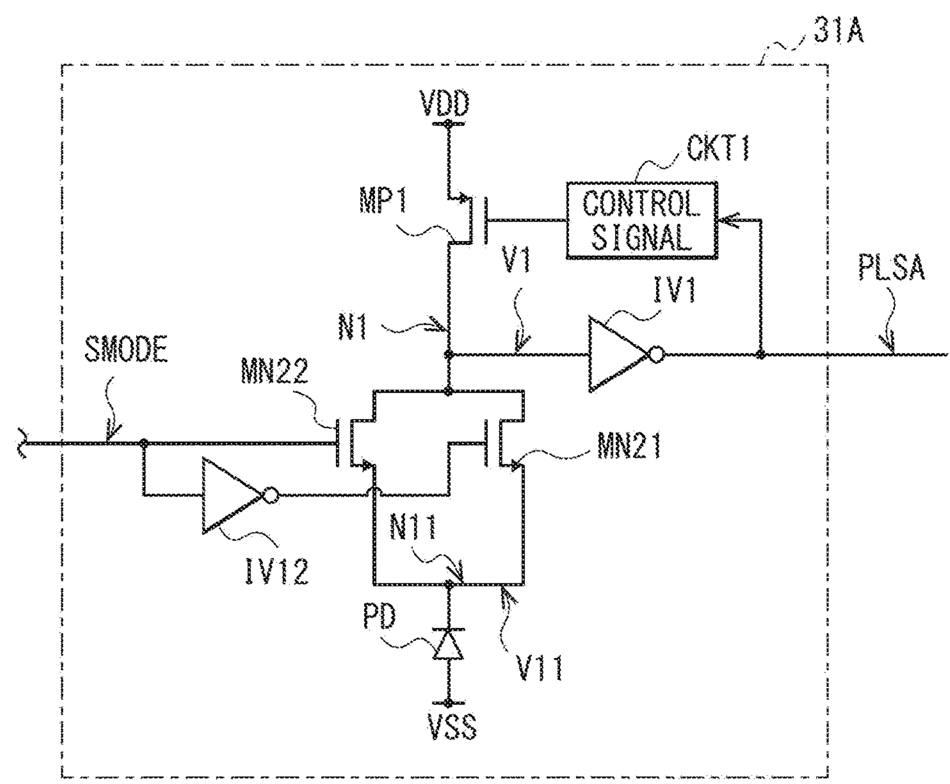

[FIG. 37]
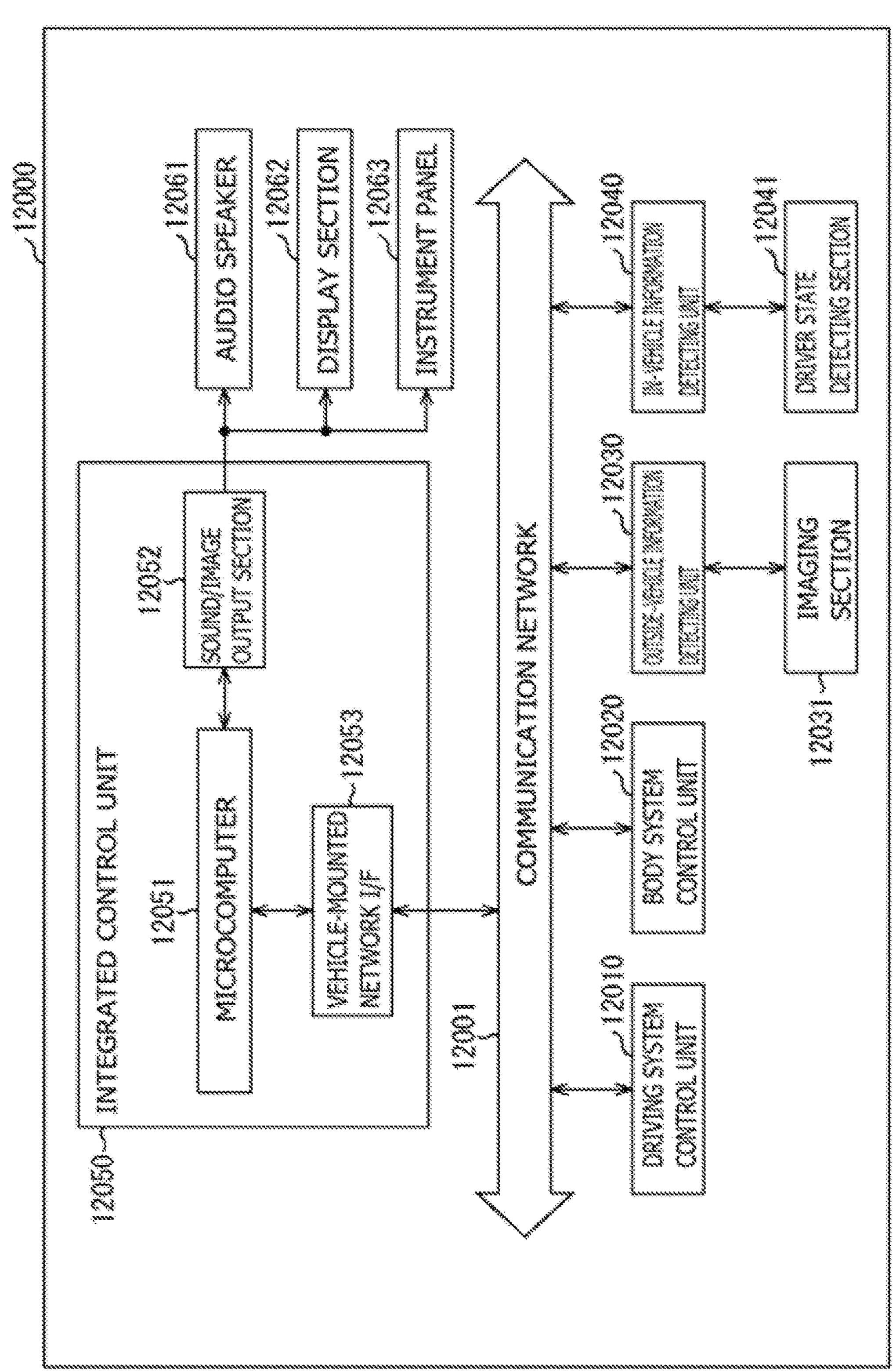

[FIG. 38]
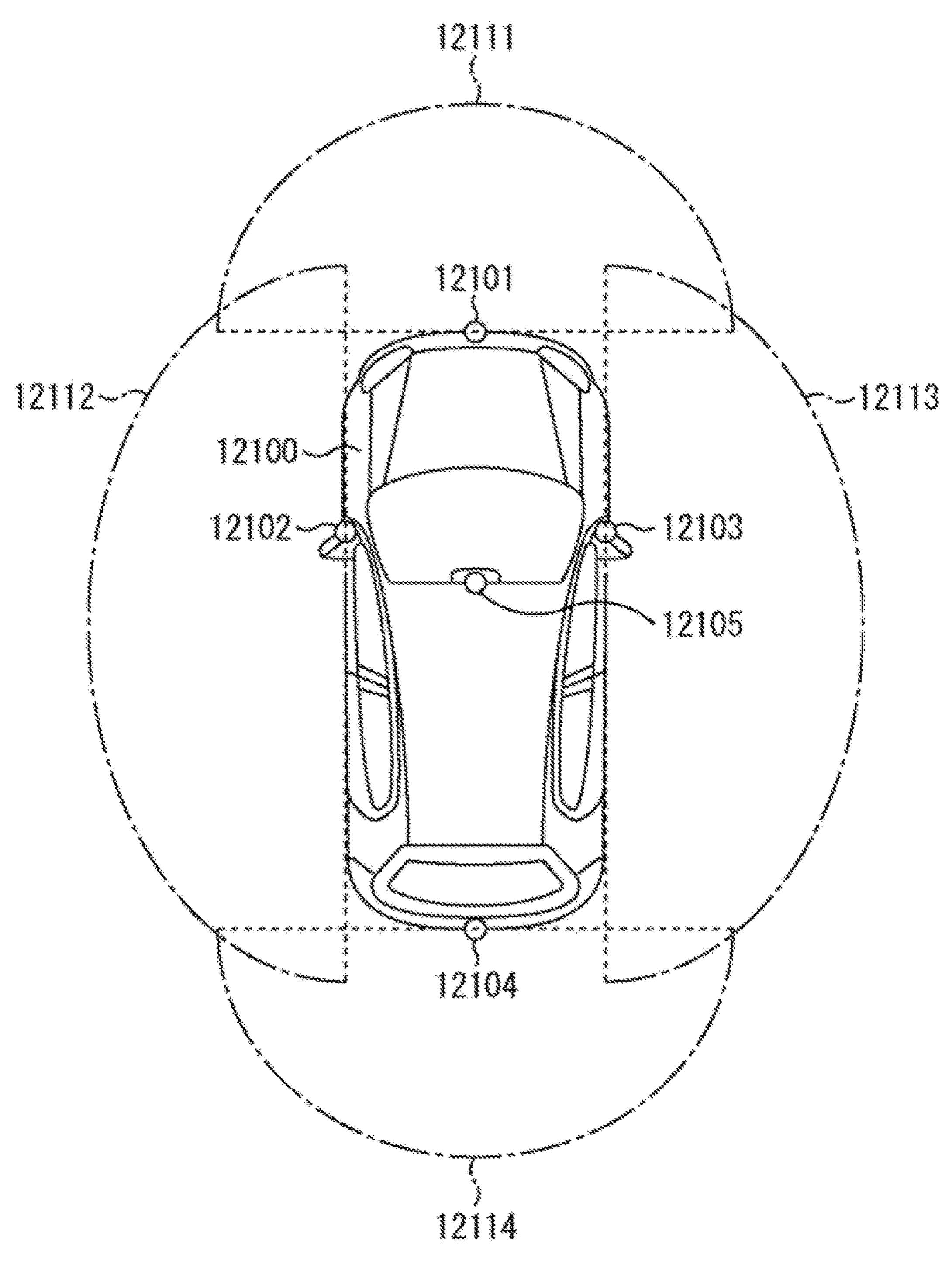

PHOTODETECTION DEVICE AND PHOTODETECTION SYSTEM

CROSS REFERENCE TO RELATED APPLICATIONS

This application is a U.S. National Phase of International Patent Application No. PCT/JP2021/034175 filed on Sep. 16, 2021, which claims priority benefit of Japanese Patent Application No. JP 2020-183865 filed in the Japan Patent Office on Nov. 2, 2020. Each of the above-referenced applications is hereby incorporated herein by reference in its entirety.

TECHNICAL FIELD

The present disclosure relates to a photodetection device and a photodetection system that detect light.

BACKGROUND ART

A TOF (Time OF Flight) method is frequently used to measure a distance to an detection object. In this TOF method, light is emitted, and reflected light reflected by the detection object is detected. Then, in the TOF method, the distance to the measurement object is measured by measuring a time difference between a timing at which the light is emitted and a timing at which the reflected light is detected. For example, PTL 1 discloses a photodetection device that controls sensitivity of a light-receiving section on the basis of a pulse rate indicating the number of pulse signals outputted per unit time from the light-receiving section.

CITATION LIST

Patent Literature

PTL 1: Japanese Unexamined Patent Application Publication No. 2018-182051

SUMMARY OF THE INVENTION

A photodetection device is desired to have high detection accuracy, and further improvement in detection accuracy is expected.

It is desirable to provide a photodetection device and a photodetection system that make it possible to enhance detection accuracy.

A photodetection device according to an embodiment of the present disclosure includes a plurality of light-receiving sections, an adder, a divider, a plurality of counters, and a controller. Each of the plurality of light-receiving sections includes a light-receiving element, and is configured to generate a first pulse signal including a pulse corresponding to a result of light reception by the light-receiving element. The adder is configured to generate a second pulse signal by selecting one or more first pulse signals from a plurality of the first pulse signals generated by the plurality of light-receiving sections and performing addition processing on the basis of the one or more selected first pulse signals. The divider is configured to perform division processing for dividing the second pulse signal into a plurality of third pulse signals in a time division manner on the basis of a clock signal. The plurality of counters is provided corresponding to the plurality of third pulse signals, and is configured to each perform count processing on the basis of a corresponding one of the third pulse signals. The controller is configured to set signal number of the one or more pulse signals to be subjected to the addition processing on the basis of respective count values of the plurality of counters.

A photodetection system according to an embodiment of the present disclosure includes a light-emitting section and a photodetector. The light-emitting section is configured to emit light. The photodetector is configured to detect light reflected by a detection object of the light emitted from the light-emitting section. The photodetector includes a plurality of light-receiving sections, an adder, a divider, a plurality of counters, and a controller. Each of the plurality of light-receiving sections includes a light-receiving element, and is configured to generate a first pulse signal including a pulse corresponding to a result of light reception by the light-receiving element. The adder is configured to generate a second pulse signal by selecting one or more first pulse signals from a plurality of the first pulse signals generated by the plurality of light-receiving sections and performing addition processing on the basis of the one or more selected first pulse signals. The divider is configured to perform division processing for dividing the second pulse signal into a plurality of third pulse signals in a time division manner on the basis of a clock signal. The plurality of counters is provided corresponding to the plurality of third pulse signals, and is configured to each perform count processing on the basis of a corresponding one of the third pulse signals. The controller is configured to set signal number of the one or more pulse signals to be subjected to the addition processing on the basis of respective count values of the plurality of counters.

In the photodetection device and the photodetection system according to the embodiments of the present disclosure, in the plurality of light-receiving sections, the first pulse signal including a pulse corresponding to the result of light reception by the light-receiving element is generated. Then, the second pulse signal is generated by selecting one or more first pulse signals from the plurality of the first pulse signals generated by the plurality of light-receiving sections and performing addition processing on the basis of the one or more selected first pulse signals. This second pulse signal is divided into the plurality of third pulse signals in a time division manner on the basis of the clock signal. The count value is generated by performing count processing on the basis of each of the plurality of third pulse signals. Then, the signal number of the one or more pulse signals to be subjected to the addition processing is set on the basis of these count values.

BRIEF DESCRIPTION OF DRAWINGS

FIG. 1 is a block diagram illustrating a configuration example of a photodetection system according to an embodiment of the present disclosure.

FIG. 2 is a block diagram illustrating a configuration example of a photodetector illustrated in FIG. 1.

FIG. 3 is a circuit diagram illustrating a configuration example of a photodetection unit illustrated in FIG. 2.

FIG. 4A is a circuit diagram illustrating a configuration example of a light-receiving section illustrated in FIG. 3.

FIG. 4B is a circuit diagram illustrating another configuration example of the light-receiving section illustrated in FIG. 3.

FIG. 5 is a block diagram illustrating a configuration example of an adder illustrated in FIG. 3.

FIG. 6A is a block diagram illustrating a configuration example of a light intensity determining section illustrated in FIG. 3.

FIG. 6B is a block diagram illustrating another configuration example of the light intensity determining section illustrated in FIG. 3.

FIG. 6C is a block diagram illustrating another configuration example of the light intensity determining section illustrated in FIG. 3.

FIG. 7 is a block diagram illustrating an operation example in an imaging mode of the photodetection unit illustrated in FIG. 3.

FIGS. 8A, 8B, 8C, 8D, 8E, and 8F are timing waveform diagrams illustrating an operation example in the imaging mode of the photodetection unit illustrated in FIG. 3.

FIG. 9 is a block diagram illustrating an operation example in a distance measurement mode of the photodetection unit illustrated in FIG. 3.

FIGS. 10A, 10B, 10C, 10D, 10E, 10F, 10G, 10H, 10I, 10J, and 10K are timing waveform diagrams illustrating an operation example in the distance measurement mode of the photodetection unit illustrated in FIG. 3.

FIG. 11 is an explanatory diagram illustrating an operation example of a photodetection array in the distance measurement mode.

FIG. 12 is a block diagram illustrating a configuration example of a light intensity determining section according to a modification example.

FIG. 13 is a block diagram illustrating an operation example of an adder according to the modification example.

FIG. 14 is an explanatory diagram illustrating an implementation example of a photodetector according to another modification example.

FIG. 15A is a circuit diagram illustrating a configuration example of a light-receiving section according to another modification example.

FIG. 15B is a circuit diagram illustrating another configuration example of the light-receiving section according to another modification example.

FIG. 16 is a block diagram illustrating a configuration example of a photodetection system according to another modification example.

FIG. 17 is a block diagram illustrating a configuration example of a photodetector illustrated in FIG. 16.

FIG. 18 is a circuit diagram illustrating a configuration example of a photodetection unit illustrated in FIG. 17.

FIGS. 19A, 19B, 19C, 19D, 19E, 19F, 19G, 19H, 19I, and 19J are timing waveform diagrams illustrating an operation example of the photodetection unit illustrated in FIG. 18.

FIG. 20 is a circuit diagram illustrating a configuration example of a light-receiving section according to another modification example.

FIG. 21 is a circuit diagram illustrating a configuration example of an adder according to another modification example.

FIG. 22A is a circuit diagram illustrating a configuration example of a light-receiving section according to another modification example.

FIG. 22B is a circuit diagram illustrating a configuration example of a light-receiving section according to another modification example.

FIG. 23 is a circuit diagram illustrating an operation example of a photodetection unit according to another modification example.

FIG. 24 is a circuit diagram illustrating another operation example of a photodetection unit according to another modification example.

FIG. 25 is a circuit diagram illustrating another operation example of a photodetection unit according to another modification example.

FIG. 26 is a circuit diagram illustrating another operation example of a photodetection unit according to another modification example.

FIG. 27 is a circuit diagram illustrating a configuration example of a light-receiving section according to another modification example.

FIGS. 28A, 28B, 28C, 28D, 28E, 28F, and 28G are timing waveform diagrams illustrating an operation example of the light-receiving section illustrated in FIG. 27.

FIG. 29 is a circuit diagram illustrating a configuration example of a light-receiving section according to another modification example.

FIGS. 30A, 30B, 30C, and 30D are timing waveform diagrams illustrating an operation example in the imaging mode of the light-receiving section illustrated in FIG. 29.

FIG. 31 is a circuit diagram illustrating an operation example in the imaging mode of the light-receiving section illustrated in FIG. 29.

FIGS. 32A, 32B, 32C, and 32D are timing waveform diagrams illustrating an operation example in the distance measurement mode of the light-receiving section illustrated in FIG. 29.

MODES FOR CARRYING OUT THE INVENTION

In the following, some embodiments of the present disclosure are described in detail with reference to the drawings. It is to be noted that description is given in the following order.

1. Embodiment
2. Example of Application to Mobile Body

1. Embodiment

[Configuration Example]

FIG. 1 illustrates a configuration example of a photodetection system (photodetection system 1) according to an embodiment. The photodetection system 1 is configured to be operable as an image sensor and be operable as a ToF sensor. The photodetection system 1 includes a light-emitting section 11, an optical system 12, a photodetector 20, and a controller 14.

The light-emitting section 11 is configured to emit a light pulse L0 toward a detection object OBJ on the basis of an instruction from the controller 14. The light-emitting section 11 emits the light pulse L0 on the basis of an instruction from the controller 14 by performing a light emission operation of alternately repeating emission and non-emission of light. The light-emitting section 11 includes, for example, a light source that emits infrared light. This light source includes, for example, a laser light source, an LED (Light Emitting Diode), or the like.

The optical system 12 includes a lens that forms an image on a light-receiving surface S of the photodetector 20.

The photodetector 20 is configured to detect light on the basis of an instruction from the controller 14. The photodetector 20 then outputs image data based on a detection result as data DT.

The controller 14 is configured to supply the light-emitting section 11 and the photodetector 20 with control signals and control operations of the light-emitting section 11 and the photodetector 20 to thereby control an operation of the photodetection system 1. The controller 14 includes a mode setting section 15. The mode setting section 15 is configured to set an operation mode M of the photodetection system 1. The photodetection system 1 is operable in an imaging mode MA and a distance measurement mode MB. The imaging mode MA is a mode in which an image of a subject is captured on the basis of light L10 from the subject. The distance measurement mode MB is a mode in which the light pulse L0 is emitted and a reflected light pulse L1 reflected by the detection object OBJ is detected to thereby measure a time difference between a timing at which the light pulse L0 is emitted and a timing at which the reflected light pulse L1 is detected. The mode setting section 15 sets one of the imaging mode MA and the distance measurement mode MB as the operation mode M. Further, the controller 14 controls the operation of the photodetection system 1 in accordance with the set operation mode M.

FIG. 2 illustrates a configuration example of the photodetector 20. The photodetector 20 includes photodetection array 21, a signal generator 22, a readout controller 23, a signal processor 24, and a photodetection controller 25.

The photodetection array 21 includes a plurality of photodetection units U disposed in a matrix. The photodetection units U are each configured to detect light and count the number of detection times.

FIG. 3 illustrates a configuration example of the photodetection unit U. The photodetection unit U includes a plurality of light-receiving sections 31 (four light-receiving sections 31A to 31D in this example), an adder 32, a plurality of selectors 33 (four selectors 33A to 33D in this example), a plurality of switches 34 (four switches 34A to 34D in this example), a plurality of counters 35 (four counters 35A to 35D in this example), and a light intensity determining section 36.

Each of the plurality of light-receiving sections 31 is configured to detect light to thereby generate a pulse signal PLSA including a pulse corresponding to the detected light. The light-receiving section 31A generates a pulse signal PLS (pulse signal PLSA) by detecting light. The light-receiving section 31B generates the pulse signal PLS (pulse signal PLSB) by detecting light. The light-receiving section 31C generates the pulse signal PLS (pulse signal PLSC) by detecting light. The light-receiving section 31D generates the pulse signal PLS (pulse signal PLSD) by detecting light. The following describes the light-receiving section 31A as an example. It is to be noted that the same applies to the light-receiving sections 31B to 31D.

FIG. 4A illustrates a configuration example of the light-receiving section 31A. In this example, the light-receiving section 31A includes a photodiode PD, a resistor R1, and an inverter IV1.

The photodiode PD is a photoelectric conversion element that converts light into electric charge. The photodiode PD has an anode supplied with a power supply voltage VSS, and a cathode coupled to a node N1. It is possible to use, for example, an avalanche photodiode (APD; Avalanche Photodiode), a single photon avalanche diode (SPAD; Single Photon Avalanche Diode), or the like for the photodiode PD.

The resistor R1 has one end supplied with a power supply voltage VDD, and another end coupled to the node N1.

The inverter IV1 is configured to output a low level in a case where a voltage at the node N1 is higher than a logical threshold, and output a high level in a case where the voltage at the node N1 is lower than the logical threshold to thereby generate the pulse signal PLSA.

With this configuration, in the light-receiving section 31A, the photodiode PD causes avalanche amplification by detecting light, which decreases the voltage at the node N1. Then, in a case where the voltage at the node N1 becomes lower than the logical threshold of the inverter IV1, the pulse signal PLSA changes from the low level to the high level. Thereafter, a current flows into the node N1 through the resistor R1 to thereby increase the voltage at the node N1. Then, in a case where the voltage at the node N1 becomes higher than the logical threshold of the inverter IV1, the pulse signal PLSA changes from the high level to the low level. Thus, the light-receiving section 31A generates the pulse signal PLSA including a pulse corresponding to the detected light.

FIG. 4B illustrates another configuration example of the light-receiving section 31A. In this example, the light-receiving section 31A includes the photodiode PD, a transistor MP1, the inverter IV1, and a control circuit CKT1.

The transistor MP1 is a P-type MOS (Metal Oxide Semiconductor) transistor, and has a gate coupled to an output terminal of the control circuit CKT1, a source supplied with the power supply voltage VDD, and a drain coupled to the node N1.

The control circuit CKT1 is configured to control an operation of the transistor MP1 on the basis of the pulse signal PLSA. Specifically, the control circuit CKT1 changes a voltage at the gate of the transistor MP1 to the low level after the pulse signal PLSA changes from the low level to the high level, and changes the voltage at the gate of the transistor MP1 to the high level after the pulse signal PLSA changes from the high level to the low level.

With this configuration, in the light-receiving section 31A, the photodiode PD detects light to thereby decrease the voltage at the node N1. Then, in a case where the voltage at the node N1 becomes lower than the logical threshold of the inverter IV1, the pulse signal PLSA changes from the low level to the high level. After this change in the pulse signal PLSA, the control circuit CKT1 changes the voltage at the gate of the transistor MP1 to the low level. Accordingly, the transistor MP1 is turned on to cause a current to flow into the node N1 through the transistor MP1, which increases the voltage at the node N1. Then, in a case where the voltage at the node N1 becomes higher than the logical threshold of the inverter IV1, the pulse signal PLSA changes from the high level to the low level. After this change in the pulse signal PLSA, the control circuit CKT1 changes the voltage at the gate of the transistor MP1 to the high level. This turns off the transistor MP1. Thus, the light-receiving section 31A generates the pulse signal PLSA including a pulse corresponding to the detected light.

The adder 32 (FIG. 3) is configured to generate a pulse signal PLS1 by performing addition processing on the basis of the pulse signals PLSA, PLSB, PLSC, and PLSD and a control signal CTL generated by the light intensity determining section 36.

FIG. 5 illustrates a configuration example of the adder 32. The adder 32 includes switches SWA, SWB, SWC, and SWD, a logical OR (OR) circuit OR1, and an addition controller CKT2.

The switch SWA is configured to turn on or off supply of the pulse signal PLSA to the OR circuit OR1 on the basis of a control signal supplied from the addition controller CKT2. Specifically, in a case where the switch SWA is on, the switch SWA supplies the pulse signal PLSA to the OR circuit OR1, and in a case where the switch SWA is off, the switch SWA supplies a low-level signal to the OR circuit OR1. The switch SWA includes, for example, a logical AND (AND) circuit or an OR circuit.

Likewise, the switch SWB is configured to turn on or off supply of the pulse signal PLSB to the OR circuit OR1 on the basis of a control signal supplied from the addition controller CKT2. The switch SWC is configured to turn on or off supply of the pulse signal PLSC to the OR circuit OR1 on the basis of a control signal supplied from the addition controller CKT2. The switch SWD is configured to turn on or off supply of the pulse signal PLSD to the OR circuit OR1 on the basis of a control signal supplied from the addition controller CKT2.

The OR circuit OR1 configured to generate the pulse signal PLS1 by finding logical OR of four signals supplied from the switches SWA to SWD.

The addition controller CKT2 sets signal number NUM of pulse signals PLS to be subjected to addition processing of four pulse signals PLS (pulse signals PLSA to PLSD) on the basis of the control signal CTL, and supply a control signal to each of the switches SWA to SWD on the basis of a result of the setting.

With this configuration, for example, in a case where the control signal CTL indicates that light intensity is high, the addition controller CKT2 sets the signal number NUM of the pulse signals PLS to be subjected to addition processing to “1”, and turns on the switch SWA and turns off the switches SWB to SWD, for example. Accordingly, the adder 32 generates the pulse signal PLS1 that changes to the high level in a period in which the pulse signal PLSA is at the high level and changes to the low level in other periods. In other words, the adder 32 generates the pulse signal PLS1 having a waveform similar to that of the pulse signal PLSA.

In addition, for example, in a case where the control signal CTL indicates that light intensity is low, the addition controller CKT2 sets the signal number NUM of the pulse signals PLS to be subjected to addition processing to “4”, and turns on the switches SWA to SWD. Accordingly, the adder 32 generates the pulse signal PLS1 that changes to the high level in the period in which the pulse signal PLSA is at the high level, in a period in which the pulse signal PLSB is at the high level, in a period in which the pulse signal PLSC is at the high level, and in a period in which the pulse signal PLSD is at the high level, and changes to the low level in other periods.

The selector 33A (FIG. 3) is configured to select one of the pulse signal PLSA and the pulse signal PLS1 on the basis of a mode control signal SMODE and output the selected pulse signal as a pulse signal PLSA1. The mode control signal SMODE in this example is at a low level “0” in a case where the operation mode M is the imaging mode MA and is at a high level “1” in a case where the operation mode M is the distance measurement mode MB. Accordingly, the selector 33A selects the pulse signal PLSA in a case where the operation mode M is the imaging mode MA, and outputs this pulse signal PLSA as the pulse signal PLSA1. In addition, the selector 33A selects the pulse signal PLS1 in a case where the operation mode M is the distance measurement mode MB, and outputs this pulse signal PLS1 as the pulse signal PLSA1.

Likewise, the selector 33B is configured to select one of the pulse signal PLSB and the pulse signal PLS1 on the basis of the mode control signal SMODE and output the selected pulse signal as a pulse signal PLSB1. The selector 33C is configured to select one of the pulse signal PLSC and the pulse signal PLS1 on the basis of the mode control signal SMODE and output the selected pulse signal as a pulse signal PLSC1. The selector 33D is configured to select one of the pulse signal PLSD and the pulse signal PLS1 on the basis of the mode control signal SMODE and output the selected pulse signal as a pulse signal PLSD1.

The switch 34A is configured to turn on or off supply of the pulse signal PLSA1 to the counter 35A on the basis of a clock signal CLKA. Specifically, the switch 34A supplies the pulse signal PLSA1 to the counter 35A in a case where the clock signal CLKA is at the high level, and supplies a low-level signal to the counter 35A in a case where the clock signal CLKA is at the low level. The switch 34A includes, for example, an AND circuit or an OR circuit.

Likewise, the switch 34B is configured to turn on or off supply of the pulse signal PLSB1 to the counter 35B on the basis of a clock signal CLKB. The switch 34C is configured to turn on or off supply of the pulse signal PLSC1 to the counter 35C on the basis of a clock signal CLKC. The switch 34D is configured to turn on or off supply of the pulse signal PLSD1 to the counter 35D on the basis of a clock signal CLKD.

In a case where the operation mode M is the imaging mode MA, the clock signals CLKA to CLKD to be supplied to the switches 34A to 34D rise at the same timing and falls at the same timing. Accordingly, the switches 34A to 34D respectively supplies the pulse signals PLSA1 to PLSD1 as it is to the counters 35A to 35D in a period in which the clock signals CLKA to CLKD are at the high level. In addition, in a case where the operation mode M is the distance measurement mode MB, the clock signals CLKA to CLKD to be supplied to the switches 34A to 34D are four-phase clock signals. In the distance measurement mode MB, the pulse signals PLSA1 to PLSD1 each are the pulse signal PLS1 generated by the adder 32. Accordingly, the switches 34A to 34D divides this pulse signal PLS1 into four pulse signals in a time division manner on the basis of the clock signals CLKA to CLKD.

The counter 35A is configured to increment a count value CNTA by performing count processing on the basis of a rising edge of the pulse signal supplied from the switch 34A. Likewise, the counter 35B is configured to increment a count value CNTB by performing count processing on the basis of a rising edge of the pulse signal supplied from the switch 34B. The counter 35C is configured to increment a count value CNTC by performing count processing on the basis of a rising edge of the pulse signal supplied from the switch 34C. The counter 35D is configured to increment a count value CNTD by performing count processing on the basis of a rising edge of the pulse signal supplied from the switch 34D.

The light intensity determining section 36 is configured to determine light intensity on the basis of the count values CNTA to CNTD of the counters 35A to 35D. Specifically, in a case where the operation mode M is the imaging mode MA, the light intensity determining section 36 determines whether or not light intensity is high, on the basis of the count values CNTA to CNTD. The light intensity determining section 36 then supplies a result of such determination to the adder 32 with use of the control signal CTL upon changing the operation mode M from the imaging mode MA to the distance measurement mode MB.

FIG. 6A illustrates a configuration example of the light intensity determining section 36. In this example, the light intensity determining section 36 includes an adder ADD1 and a comparator CP1. The adder ADD1 is configured to calculate a total value of the count values CNT1 to CNT4. The comparator CP1 is configured to generate the control signal by comparing the total value obtained by the adder ADD1 with a predetermined threshold REF. In this example, the light intensity determining section 36 determines that the light intensity is high in a case where the total value of the count values CNT1 to CNT4 is larger than the threshold REF, and determines that the light intensity is low in a case where the total value of the count values CNT1 to CNT4 is smaller than the threshold REF.

FIG. 6B illustrates another configuration example of the light intensity determining section 36. In this example, the light intensity determining section 36 includes latches LTA to LTD and an OR circuit OR2. The latch LTA is configured to set an output signal to the high level on the basis that a most significant bit (MSB; Most Significant Bit) value in bit data of the count value CNTA has changed from "1" to "0". Likewise, the latch LTB is configured to set an output signal to the high level on the basis that a most significant bit value in bit data of the count value CNTB has changed from "1" to "0". The latch LTC is configured to set an output signal to the high level on the basis that a most significant bit value in bit data of the count value CNTC has changed from "1" to "0". The latch LTD is configured to set an output signal to the high level on the basis that a most significant bit value in bit data of the count value CNTD has changed from "1" to "0". The OR circuit OR2 is configured to generate the control signal CTL by finding logical OR of signals supplied from the latches LTA to LTD. In this example, the light intensity determining section 36 determines that the light intensity is high in a case where at least one of the count values CNT1 to CNT4 makes a round, and determines that the light intensity is low in a case where none of the count values CNT1 to CNT4 makes a round.

FIG. 6C illustrates another configuration example of the light intensity determining section 36. In this example, the light intensity determining section 36 includes the latches LTA to LTD, and a logical AND (AND) circuit AND1. The AND circuit AND1 is configured to generate the control signal CTL by finding logical AND of signals supplied from the latches LTA to LTD. In this example, the light intensity determining section 36 determines that the light intensity is high in a case where all the count values CNT1 to CNT4 make a round, and determines that the light intensity is low in a case where any of the count values CNT1 to CNT4 does not make a round.

The signal generator 22 (FIG. 2) is configured to generate the clock signal CLKA to CLKD and the mode control signal SMODE on the basis of an instruction from the photodetection controller 25 and supply the clock signals CLKA to CLKD and the mode control signal SMODE to the plurality of photodetection units U in the photodetection array 21.

The readout controller 23 is configured to control an operation of supplying the signal processor 24 with the count values CNTA to CNTD generated in each of the plurality of photodetection units U in the photodetection array 21, on the basis of an instruction from the photodetection controller 25. For example, the readout controller 23 controls operations of the plurality of photodetection units U to sequentially select the photodetection units U for one row, and cause the selected photodetection units U to supply the count values CNTA to CNTD to the signal processor 24.

The signal processor 24 is configured to perform predetermined signal processing on the basis of an instruction from the photodetection controller 25. Specifically, in a case where the operation mode M is the imaging mode MA, the signal processor 24 generates image data of a captured image by performing predetermined image processing, on the basis of the count values CNTA to CNTD supplied from each of the plurality of photodetection units U in the photodetection array 21. In addition, in a case where the operation mode M is the distance measurement mode MB, the signal processor 24 generates image data of a distance image by measuring time from emission of the light pulse L0 by the light-emitting section 11 to detection of the reflected light pulse L1 by the photodetection unit U, on the basis of the count values CNTA to CNTD supplied from each of the plurality of photodetection units U in the photodetection array 21. The signal processor 24 then outputs the generated image data as the data DT.

The photodetection controller 25 is configured to control the operation of the photodetector 20 on the basis of an instruction from the controller 14 (FIG. 1) by supplying the signal generator 22, the readout controller 23, and the signal processor 24 with control signals and controlling operations of the signal generator 22, the readout controller 23, and the signal processor 24.

Here, the light-receiving section 31 corresponds to a specific example of a "light-receiving section" in the present disclosure. The photodiode PD corresponds to a specific example of a "light-receiving element" in the present disclosure. The pulse signal PLS corresponds to a specific example of a "first pulse signal" in the present disclosure. The switches SWA to SWD and the OR circuit OR1 correspond to specific examples of an "adder" in the present disclosure. The pulse signal PLS1 corresponds to a specific example of a "second pulse signal" in the present disclosure. The switches 34A to 34D correspond to specific examples of a "divider" in the present disclosure. The counter 35 corresponds to a specific example of a "counter" in the present disclosure. The light intensity determining section 36 and the addition controller CKT2 correspond to specific examples of a "controller" in the present disclosure. The distance measurement mode MB corresponds to a specific example of a "first operation mode" in the present disclosure. The imaging mode MA corresponds to a specific example of a "second operation mode" in the present disclosure.

[Operation and Workings]

Next, the operation and workings of the photodetection system 1 according to the present embodiment are described.

(Overview of Overall Operation)

First, an overview of the overall operation of the photodetection system 1 is described with reference to FIGS. 1 and 2.

In a case where the operation mode M is the imaging mode MA, the optical system 12 forms an image on the light-receiving surface S of the photodetector 20. The photodetector 20 detects light. The controller 14 supplies the photodetector 20 with a control signal and controls an operation of the photodetector 20 to thereby control an imaging operation of the photodetection system 1.

In a case where the operation mode M is the distance measurement mode MB, the light-emitting section 11 emits the light pulse L0 toward the detection object OBJ. The optical system 12 forms an image on the light-receiving surface S of the photodetector 20. The photodetector 20 detects the reflected light pulse L1. The controller 14 supplies the light-emitting section 11 and the photodetector 20 with control signals and controls operations of the light-emitting section 11 and the photodetector 20 to thereby control a distance measurement operation of the photodetection system 1.

In the photodetector 20, the photodetection units U of the photodetection array 21 generate the count values CNTA to CNTD by detecting light. The signal generator 22 generates the clock signals CLKA to CLKD and the mode control signal SMODE, and supplies the plurality of photodetection units U with the clock signals CLKA to CLKD and the mode control signal SMODE. The readout controller 23 controls an operation of supplying the signal processor 24 with the count values CNTA to CNTD generated in each of the plurality of photodetection units U in the photodetection array 21. The signal processor 24 performs predetermined signal processing on the basis of the count values CNTA to CNTD supplied from each of the plurality of photodetection units U in the photodetection array 21 to generate image data, and outputs the generated image data as the data DT. The photodetection controller 25 controls the operation of the photodetector 20 on the basis of an instruction from the controller 14 by supplying the signal generator 22, the readout controller 23, and the signal processor 24 with control signals and controlling the operations of the signal generator 22, the readout controller 23, and the signal processor 24.

(Detailed Operation)

FIG. 7 illustrates an operation example of the photodetection unit U in a case where the operation mode M is the imaging mode MA. In FIG. 7, the selectors 33A to 33D and the switches 34A to 34D each are illustrated with use of an illustration of a switch indicating its state. In the imaging mode MA, the selector 33A outputs the pulse signal PLSA as the pulse signal PLSA1. The selector 33B outputs the pulse signal PLSB as the pulse signal PLSB1. The selector 33C outputs the pulse signal PLSC as the pulse signal PLSC1. The selector 33D outputs the pulse signal PLSD as the pulse signal PLSD1. The switches 34A to 34D then turn on or off simultaneously on the basis of the clock signals CLKA to CLKD. In FIG. 7, the switches 34A to 34D are on.

FIGS. 8A, 8B, 8C, 8D, 8E, and 8F illustrate an operation example of the photodetector 20 in a case where an imaging operation is performed. FIG. 8A indicates a waveform of the mode control signal SMODE. FIGS. 8B, 8C, 8D, and 8E respectively indicate waveforms of the clock signals CLKA to CLKD. FIG. 8F indicates the operation of the readout controller 23.

In a case where the imaging operation is performed, the signal generator 22 changes the mode control signal SMODE to the low level (FIG. 8A). In each of the plurality of photodetection units U, the light-receiving sections 31A to 31D respectively generate the pulse signals PLSA to PLSD by detecting light. Accordingly, as illustrated in FIG. 7, the selectors 33A to 33D respectively output the pulse signals PLSA to PLSD as the pulse signals PLSA1 to PLSD1. The signal generator 22 then generates the clock signals CLKA to CLKD that simultaneously change between the high level and the low level (FIGS. 8B, 8C, 8D, and 8E).

At a timing t11, a frame period F starts. At this timing t11, the signal generator 22 changes the clock signals CLKA to CLKD from the low level to the high level (FIGS. 8B, 8C, 8D, and 8E). Accordingly, in a period from the timing t11 to a timing t12, the switch 34A supplies the pulse signal PLSA1 to the counter 35A, the switch 34B supplies the pulse signal PLSB1 to the counter 35B, the switch 34C supplies the pulse signal PLSC1 to the counter 35C, and the switch 34D supplies the pulse signal PLSD1 to the counter 35D.

The counter 35A then performs count processing on the basis of a rising edge of the pulse signal PLSA1 supplied from the switch 34A to increment the count value CNTA. Likewise, the counter 35B performs count processing on the basis of a rising edge of the pulse signal PLSB1 supplied from the switch 34B to increment the count value CNTB. The counter 35C performs count processing on the basis of a rising edge of the pulse signal PLSC1 supplied from the switch 34C to increment the count value CNTC. The counter 35D performs count processing on the basis of a rising edge of the pulse signal PLSD1 supplied from the switch 34D to increment the count value CNTD.

Then, at the timing t12, the signal generator 22 changes the clock signals CLKA to CLKD from the high level to the low level (FIGS. 8B, 8C, 8D, and 8E). Accordingly, the switches 34A to 34D stop supply of the pulse signals PLSA1 to PLSD1 to the counters 35A to 35D.

Then, in a period from the timing t12 to a timing t13, the readout controller 23 performs readout control CR, thereby controlling operations of the plurality of photodetection units U to supply the signal processor 24 with the count values CNTA to CNTD generated in each of the plurality of photodetection units U. Thereafter, the count values CNTA to CNTD in the counters 35A to 35D are reset. Then, at this timing t13, the frame period F ends.

The photodetector 20 repeats such an operation from the timing t11 to the timing t13. The signal processor 24 then performs predetermined image processing on the basis of the count values CNTA to CNTD supplied from each of the plurality of photodetection units U to generate data of a captured image, and outputs the generated data as the data DT.

FIG. 9 illustrates an operation example of the photodetection unit in a case where the operation mode M is the distance measurement mode MB. In the distance measurement mode MB, the selector 33A outputs the pulse signal PLS1 as the pulse signal PLSA1, the selector 33B outputs the pulse signal PLS1 as the pulse signal PLSB1, the selector 33C outputs the pulse signal PLS1 as the pulse signal PLSC1, and the selector 33D outputs the pulse signal PLS1 as the pulse signal PLSD1. The switches 34A to 34D are then turned on or off in a time division manner on the basis of the clock signals CLKA to CLKD that configure a four-phase clock signal. In FIG. 9, the switch 34A is on, and the switches 34B to 34D are off.

FIGS. 10A, 10B, 10C, 10D, 10E, 10F, 10G, 10H, 10I, 10J, and 10K illustrate an operation example of the photodetector 20 in a case where the distance measurement operation is performed. FIG. 10A indicates a waveform of the mode control signal SMODE. FIG. 10B indicates a waveform of light emitted from the light-emitting section 11. FIGS. 10C, 10D, 10E, and 10F respectively indicate waveforms of the clock signals CLKA to CLKD. FIG. 10G indicates a waveform of the control signal CTL (control signal CTL1) in a certain photodetection unit U (photodetection unit U1). FIG. 10H indicates the signal number NUM (signal number NUM1) of the pulse signals PLS to be subjected to addition processing by the adder 32 of the photodetection unit U1. FIG. 10I indicates a waveform of the control signal CTL (control signal CTL2) in another certain photodetection unit U (photodetection unit U2). FIG. 10J indicates the signal number NUM (signal number NUM2) of the pulse signals PLS to be subjected to addition processing by the adder 32 of the photodetection unit U2. FIG. 10K indicates the operation of the readout controller 23.

In a case where the distance measurement operation is performed, for preparation for the distance measurement operation, the signal generator 22 changes the mode control signal SMODE to the low level similarly to the imaging operation (FIG. 10A). Accordingly, the selectors 33A to 33D respectively output the pulse signals PLSA to PLSD as the pulse signals PLSA1 to PLSD1 similarly to the imaging operation (FIG. 7).

Then, at a timing t21, the signal generator 22 changes the clock signals CLKA to CLKD from the low level to the high level (FIGS. 10C, 10D, 10E, and 10F). Accordingly, in a period from the timing t21 to a timing t22, the switch 34A supplies the pulse signal PLSA1 to the counter 35A, the switch 34B supplies the pulse signal PLSB1 to the counter 35B, the switch 34C supplies the pulse signal PLSC1 to the counter 35C, and the switch 34D supplies the pulse signal PLSD1 to the counter 35D.

In the period from the timing t21 to the timing t22, the light-emitting section 11 may emit light or may not emit light (FIG. 10B).

Then, the counter 35A performs count processing on the basis of a rising edge of the pulse signal PLSA1 supplied from the switch 34A to increment the count value CNTA. Likewise, the counter 35B performs count processing on the basis of a rising edge of the pulse signal PLSB1 supplied from the switch 34B to increment the count value CNTB. The counter 35C performs count processing on the basis of a rising edge of the pulse signal PLSC1 supplied from the switch 34C to increment the count value CNTC. The counter 35D performs count processing on the basis of a rising edge of the pulse signal PLSD1 supplied from the switch 34D to increment the count value CNTD.

Then, at the timing t22, the signal generator 22 changes the clock signals CLKA to CLKD from the high level to the low level (FIGS. 10C, 10D, 10E, and 10F). Accordingly, the switches 34A to 34D stop supply of the pulse signals PLSA1 to PLSD1 to the counters 35A to 35D.

Then, after the timing t22, the light intensity determining section 36 determines light intensity on the basis of the count values CNTA to CNTD of the counters 35A to 35D. The addition controller CKT2 of the adder 32 sets the signal number NUM of the pulse signals PLS to be subjected to addition processing of four pulse signals PLS (pulse signals PLSA to PLSD), on the basis of a result of such determination.

In this example, in the photodetection unit U1, the light intensity determining section 36 determines that light intensity obtained on the basis of the count values CNTA to CNTD of the counters 35A to 35D is high, and changes the control signal CTL to the high level at a timing t23 (FIG. 10G). The addition controller CKT2 of the adder 32 sets the signal number NUM1 of the pulse signals PLS to be subjected to addition processing to "1", on the basis of this control signal CTL1 ((H) of FIG. 10H). Accordingly, for example, the addition controller CKT2 turns on the switch SWA, and turns off the switches SWB to SWD, and the adder 32 generates the pulse signal PLS1 having a waveform similar to that of the pulse signal PLSA.

In addition, in the photodetection unit U2, the light intensity determining section 36 determines that light intensity obtained on the basis of the count values CNTA to CNTD of the counters 35A to 35D is low, and changes the control signal CTL2 to the low level at the timing t23 (FIG. 10I). The addition controller CKT2 of the adder 32 sets the signal number NUM2 of the pulse signals PLS to be subjected to addition processing to "4", on the basis of this control signal CTL2 (FIG. 10J). Accordingly, the addition controller CKT2 turns on the switches SWA to SWD, and the adder 32 generates the pulse signal PLS1 on the basis of the pulse signals PLSA to PLSD.

FIG. 11 illustrates an example of the light-receiving sections 31 that generate the pulse signal PLS to be subjected to addition processing, in the plurality of photodetection units U. In this example, the light-receiving sections 31 are disposed in two rows and two columns in the photodetection unit U. The light-receiving section 31 that is shaded indicates the light-receiving section 31 that generates the pulse signal PLS to be subjected to addition processing, and the light-receiving section 31 that is not shaded is the light-receiving section 31 that generates the pulse signal PLS not to be subjected to addition processing. In this example, in a certain photodetection unit U, one pulse signal PLS outputted from one light-receiving section 31 of four light-receiving sections 31 is to be subjected to addition processing, and in another certain photodetection unit U, four pulse signals PLS outputted from four light-receiving sections 31 are to be subjected to addition processing. Thus, the signal number NUM is set individually in each of the plurality of photodetection units U.

Then, in a period from the timing t23 to a timing t24, the readout controller 23 performs the readout control CR, thereby controlling the operations of the plurality of photodetection units U to supply the signal processor 24 with the count values CNTA to CNTD generated by each of the plurality of photodetection units U (FIG. 10K). Thereafter, the count values CNTA to CNTD in the counters 35A to 35D are reset.

Then, at the timing t24, the signal generator 22 changes the mode control signal SMODE from the low level to the high level (FIG. 10A). Accordingly, the selectors 33A to 33D respectively output the pulse signals generated by the adder 32 as the pulse signals PLSA1 to PLSD1.

Then, in a period (detection period PDET) from a timing t25 to a timing t30, the photodetection system 1 repeatedly emits the light pulse L0, and repeatedly detects the reflected light pulse L1 reflected by the detection object OBJ.

Specifically, in a period from the timing t25 to a timing t26, the light-emitting section 11 emits light (FIG. 10B). The signal generator 22 changes the clock signal CLKA to the high level in the period from the timing t25 to the timing t26, changes the clock signal CLKB to the high level in a period from the timing t26 to a timing t27, changes the clock signal CLKC to the high level in a period from the timing t27 to a timing t28, and changes the clock signal CLKD to the high level in a period from the timing t28 to a timing t29. Accordingly, the switch 34A supplies the pulse signal PLSA1 (pulse signal PLS1) to the counter 35A in the period from the timing t25 to the timing t26, the switch 34B supplies the pulse signal PLSB1 (pulse signal PLS1) to the counter 35B in the period from the timing t26 to the timing t27, the switch 34C supplies the pulse signal PLSC1 (pulse signal PLS1) to the counter 35C in the period from the timing t27 to the timing t28, and the switch 34D supplies the pulse signal PLSD1 (pulse signal PLS1) to the counter 35D in the period from the timing t28 to the timing t29. Then, the counter 35A performs count processing on the basis of a rising edge of the pulse signal PLSA1 supplied from the switch 34A in the period from the timing t25 to the timing t26 to increment the count value CNTA. The counter 35B performs count processing on the basis of a rising edge of the pulse signal PLSB1 supplied from the switch 34B in the period from the timing t26 to the timing t27 to increment the count value CNTB. The counter 35C performs count processing on the basis of a rising edge of the pulse signal PLSC1 supplied from the switch 34C in the period from the timing t27 to the timing t28 to increment the count value CNTC. The counter 35D performs count processing on the basis of a rising edge of the pulse signal PLSD1 supplied from the switch 34D in the period from the timing t28 to the timing t29 to increment the count value CNTD.

The photodetection unit U repeats such an operation from the timing t25 to the timing t29. Accordingly, the counter 35A performs count processing in a plurality of periods in which the clock signal CLKA is at the high level to generate the count value CNTA, the counter 35B performs count processing in a plurality of periods in which the clock signal CLKB is at the high level to generate the count value CNTB, the counter 35C performs count processing in a plurality of periods in which the clock signal CLKC is at the high level to generate the count value CNTC, and the counter 35D performs count processing in a plurality of periods in which the clock signal CLKD is at the high level to generate the count value CNTD.

Then, in a period from a timing t30 to a timing t31, the readout controller 23 performs the readout control CR, thereby controlling the operations of the plurality of photodetection units U to supply the signal processor 24 with the count values CNTA to CNTD generated by each of the plurality of photodetection units U (FIG. 10K). Thereafter, the count values CNTA to CNTD in the counters 35A to 35D are reset.

The photodetection system 1 repeats such an operation from the timing t25 to the timing t31. The signal processor 24 generates data of a distance image by measuring time from emission of the light pulse L0 by the light-emitting section 11 to detection of the reflected light pulse L1 by the photodetection unit U, on the basis of the count values CNTA to CNTD supplied from each of the plurality of photodetection units U, and outputs the generated data as the data DT.

Thus, in the photodetection system 1, addition processing is performed on the basis of the plurality of pulse signals PLS (pulse signals PLSA to PLSD) generated by the plurality of light-receiving sections 31 to generate the pulse signal PLS1. Then, division processing for dividing the pulse signal PLS1 into a plurality of pulse signals in a time division manner is performed on the basis of the clock signals CLKA to CLKD, and count processing is performed on the basis of each of the plurality of pulse signals. Accordingly, for example, pulses of the plurality of pulse signals PLS are collected by addition processing to generate one pulse signal PLS1 including a plurality of pulses, which makes it possible to increase the number of pulses in the pulse signal PLS1, as compared with a case where addition processing is not performed. Accordingly, in the photodetection system 1, it is possible to enhance detection accuracy in the distance measurement operation.

In addition, in the photodetection system 1, one or more pulse signals PLS are selected from the plurality of pulse signals PLS (pulse signals PLSA to PLSD) on the basis of the control signal CTL, and addition processing is performed on the basis of the one or more selected pulse signals PLS. In addition, the signal number of one or more pulse signals is set on the basis of respective count values of a plurality of counters. Accordingly, for example, in a case where the light intensity is high, it is possible to reduce a possibility of decreasing detection accuracy in the distance measurement operation. In other words, in a case where the light intensity is high, four light-receiving sections 31A to 31D may generate the pulse signals PLSA to PLSD including pulses at timings slightly shifted from each other. For example, in a case where addition processing is performed consistently on the basis of four pulse signals PLSA to PLSD, in the pulse signal PLS1 generated by the addition processing, there is a possibility of combining pulses of such pulse signals PLSA to PLSD into one pulse. In this case, detection accuracy in the distance measurement operation is decreased. In contrast, in the photodetection system 1, for example, in a case where the light intensity is high, it is possible to reduce the signal number of the pulse signals PLS to be subjected to addition processing, which consequently makes it possible to reduce a possibility of combining the pulses of the pulse signals PLSA to PLSD. As a result, in the photodetection system 1, it is possible to reduce a possibility of decreasing detection accuracy in the distance measurement operation.

In addition, in the photodetection system 1, one or more pulse signals PLS are selected from the plurality of pulse signals PLS (pulse signals PLSA to PLSD) on the basis of the control signal CTL, and addition processing is performed on the basis of the one or more selected pulse signals PLS. Accordingly, for example, in a case where the light intensity is high, it is possible to suppress a decrease in power supply voltage. In other words, for example, in a case where addition processing is performed consistently on the basis of four pulse signals PLSA to PLSD in a state in which the light intensity is high, many pulses may be generated for a short time in the pulse signal PLS1 generated by the addition processing. In a case where may pulses are generated for a short time in the pulse signals PLS1 in many photodetection units U, a large power supply current flows for a short time, which may temporarily decrease the power supply voltage due to so-called IR drop. In contrast, in the photodetection system 1, for example, in a case where the light intensity is high, it is possible to reduce the signal number of the pulse signals PLS to be subjected to addition processing, which makes it possible to reduce a possibility of generating many pulses in the pulse signal PLS1 for a short time. This makes it possible to reduce a possibility of temporarily decreasing the power supply voltage. As a result, in the photodetection system 1, it is possible to reduce, for example, a possibility of malfunction, which makes it possible to reduce a possibility of decreasing detection accuracy in the distance measurement operation.

[Effects]

As described above, in the present embodiment, addition processing is performed on the basis of a plurality of pulse signals generated by a plurality of light-receiving sections to generate a pulse signal. Then, division processing for dividing this pulse signal into a plurality of pulse signals in a time division manner is performed on the basis of a clock signal, and count processing is performed on the basis of each of the plurality of pulse signals. This makes it possible to enhance detection accuracy in the distance measurement operation.

In the present embodiment, one or more pulse signals are selected from a plurality of pulse signals on the basis of a control signal, and addition processing is performed on the basis of the one or more selected pulse signals to generate a pulse signal. In addition, the signal number of one or more pulse signals is set on the basis of respective count values of a plurality of counters. This makes it possible to reduce a possibility of decreasing detection accuracy in the distance measurement operation.

In the present embodiment, one or more pulse signals are selected from a plurality of pulse signals on the basis of a control signal, and addition processing is performed on the basis of the one or more selected pulse signals to generate a pulse signal, which makes it possible to reduce a possibility of temporarily decreasing a power supply voltage. This consequently makes it possible to reduce a possibility of decreasing detection accuracy in the distance measurement operation.

Modification Example 1

In the embodiment described above, the light intensity determining section 36 determines whether light intensity is high or low, and the addition controller CKT2 of the adder 32 sets the signal number NUM of the pulse signals PLS to be subjected to addition processing of four pulse signals PLS (pulse signals PLSA to PLSD) to "1" or "4" on the basis of a result of such determination, but this is not limitative. The photodetection unit U according to the present modification example is described in detail below. The photodetection unit U according to the present modification example includes a light intensity determining section 36B and an adder 32B, as with the embodiment (FIG. 3) described above.

FIG. 12 illustrates a configuration example of the light intensity determining section 36B. The light intensity determining section 36B includes the adder ADD1, the comparator CP1, and a threshold setting section CKT3. In this example, the threshold setting circuit CKT3 is configured to sequentially generate three thresholds REF1 to REF3. The comparator CP1 sequentially compares a total value obtained by the adder ADD1 with the three thresholds REF1 to REF3.

FIG. 13 illustrates an operation example of the adder 32B. In a case where the control signal CTL indicates that the total value of the count values CNTA to CNTD is lower than the threshold REF1, an addition controller CKT2B of the adder 32B sets the signal number NUM of the pulse signals PLS to be subjected to addition processing to "4". In addition, in a case where the control signal CTL indicates that the total value of the count values CNTA to CNTD is higher than the threshold REF1 and lower than the threshold REF2, the addition controller CKT2B sets the signal number NUM of the pulse signals PLS to be subjected to additional processing to "3". In addition, in a case where the control signal CTL indicates that the total value of the count values CNTA to CNTD is higher than the threshold REF2 and lower than the threshold REF3, the addition controller CKT2B sets the signal number NUM of the pulse signals PLS to be subjected to additional processing to "2". In addition, in a case where the control signal CTL indicates that the total value of the count values CNTA to CNTD is higher than the threshold REF3, the addition controller CKT2B sets the signal number NUM of the pulse signals PLS to be subjected to additional processing to "1".

Modification Example 2

The photodetector 20 according to the embodiment described above may be formed on one semiconductor substrate, or may be formed on a plurality of semiconductor substrates. A case where the photodetector 20 is formed on two semiconductor substrates is described in detail below as an example.

FIG. 14 illustrates an implementation example of the photodetector 20. In this example, the photodetector 20 is formed on two semiconductor substrates 101 and 102. The semiconductor substrate 101 is disposed on side of the light-receiving surface S of the photodetector 20, and the semiconductor substrate 102 is disposed on side opposite to the light-receiving surface S of the photodetector 20. The semiconductor substrates 101 and 102 are superimposed on each other. A wiring line of the semiconductor substrate 101 and a wiring line of the semiconductor substrate 102 are coupled to each other by a wiring line 103. It is possible to use, for example, a metallic bond such as Cu—Cu for the wiring line 103. The photodetection units U are disposed over these two semiconductor substrates 101 and 102.

FIG. 15A illustrates a configuration example of the light-receiving section 31A. This light-receiving section 31A has the same circuit configuration as the light-receiving section 31A illustrated in FIG. 4A. In this example, the light-receiving section 31A is disposed over the two semiconductor substrates 101 and 102. Specifically, the photodiode PD is disposed on the semiconductor substrate 101, and the resistor R1 and the inverter IV1 are disposed on the semiconductor substrate 102. The photodiode PD has the cathode coupled to the other end of the resistor R1 and an input terminal of the inverter IV1 through the wiring line 103.

FIG. 15B illustrates another configuration example of the light-receiving section 31A. This light-receiving section 31A has the same circuit configuration as the light-receiving section 31A illustrated in FIG. 4B. In this example, this light-receiving section 31A is disposed over two semiconductor substrates 101 and 102. Specifically, the photodiode PD is disposed on the semiconductor substrate 101, and the transistor MP1, the inverter IV1, and the control circuit CKT1 are disposed on the semiconductor substrate 102. The photodiode PD has the cathode coupled to the drain of the transistor MP1 and the input terminal of the inverter IV1 through the wiring line 103.

The adder 32, the selectors 33A to 33D, the switches 34A to 34D, the counters 35A to and the light intensity determining section 36 in the photodetection unit U are disposed on, for example, the semiconductor substrate 102.

Modification Example 3

In the embodiment described above, both the imaging operation and the distance measurement operation are performed, but this is not limitative. Instead of this, for example, only the distance measurement operation may be performed. A photodetection system 1D according to the present modification example is described in detail below.

FIG. 16 illustrates a configuration example of the photodetection system 1D. The photodetection system 1D includes a photodetector 20D and a controller 14D. The photodetector 20D is configured to detect light on the basis of an instruction from the controller 14D. The controller 14D is configured to supply the light-emitting section 11 and the photodetector 20D with control signals and control operations of the light-emitting section 11 and the photodetector 20D to thereby control an operation of the photodetection system 1D.

FIG. 17 illustrates a configuration example of the photodetector 20D. The photodetector 20D includes a photodetection array 21D, a signal generator 22D, the readout controller 23, a signal processor 24D, and the photodetection controller 25.

The photodetection array 21D includes a plurality of photodetection units U disposed in a matrix.

FIG. 18 illustrates a configuration example of the photodetection unit U. The photodetection unit U includes a plurality of light-receiving sections 31 (four light-receiving sections 31A to 31D in this example), the adder 32, a plurality of switches 34 (four switches 34A to 34D in this example), a plurality of counters 35 (four counters 35A to 35D in this example), and the light intensity determining section 36.

The adder 32 generates the pulse signal PLS1 by performing addition processing on the basis of pulse signals PLSA, PLSB, PLSC, and PLSD and the control signal CTL generated by the light intensity determining section 36. The adder 32 then supplies the generated pulse signal PLS1 to the switches 34A to 34D.

The switch 34A turns on or off supply of the pulse signal PLS1 to the counter 35A on the basis of the clock signal CLKA. Likewise, the switch 34B turns on or off supply of the pulse signal PLS1 to the counter 35B on the basis of the clock signal CLKB. The switch 34C turns on or off supply of the pulse signal PLS1 to the counter 35C on the basis of the clock signal CLKC. The switch 34D turns on or off supply of the pulse signal PLS1 to the counter 35D on the basis of the clock signal CLKD. The switches 34A to 34D divide this pulse signal PLS1 into four pulse signals in a time division manner on the basis of the clock signals CLKA to CLKD.

The signal generator 22D (FIG. 17) is configured to generate the clock signals CLKA to CLKD on the basis of an instruction from the photodetection controller 25 and supply the clock signals CLKA to CLKD to the plurality of photodetection units U in the photodetection array 21D.

The signal processor 24D is configured to generate data of a distance image by measuring time from emission of the light pulse L0 by the light-emitting section 11 to detection of the reflected light pulse L1 by the photodetection unit U, on the basis of the count values CNTA to CNTD supplied from each of the plurality of photodetection units U in the photodetection array 21. The signal processor 24D then outputs the generated data as the data DT.

FIGS. 19A, 19B, 19C, 19D, 19E, 19F, 19G, 19H, 19I, and 19J illustrate an operation examples of the photodetector 20D. FIG. 19A indicates a waveform of light emitted from the light-emitting section 11. FIGS. 19B, 19C, 19D, and 19E respectively indicate waveforms of the clock signals CLKA to CLKD. FIG. 19F indicates a waveform of the control signal (control signal CTL1) in a certain photodetection unit U (photodetection unit U1). FIG. 19G indicates the signal number NUM (signal number NUM1) of the pulse signals PLS to be subjected to addition processing by the adder 32 of the photodetection unit U1. FIG. 19H indicates a waveform of the control signal CTL (control signal CTL2) in another certain photodetection unit U (photodetection unit U2). FIG. 19I indicates the signal number NUM (signal number NUM2) of the pulse signals PLS to be subjected to addition processing by the adder 32 of the photodetection unit U2. FIG. 19J indicates the operation of the readout controller 23.

In a period (detection period PDET) from a timing t41 to a timing t42, the photodetection system 1D repeatedly emits the light pulse L0, and repeatedly detects the reflected light pulse L1 reflected by the detection object OBJ, as with the embodiment described above (FIGS. 10A, 10B, 10C, 10D, 10E, 10F, 10G, 10H, 10I, 10J, and 10K).

Then, after the timing t42, the light intensity determining section 36 determines light intensity on the basis of the count values CNTA to CNTD of the counters 35A to 35D. The addition controller CKT2 of the adder 32 sets the signal number NUM of the pulse signals PLS to be subjected to addition processing of four pulse signals PLS (pulse signals PLSA to PLSD), on the basis of a result of such determination.

In this example, in the photodetection unit U1, the light intensity determining section 36 determines that light intensity obtained on the basis of the count values CNTA to CNTD of the counters 35A to 35D is high, and changes the control CLT 1 to the high level at a timing t43 (FIG. 19E). The addition controller CKT2 of the adder 32 sets the signal number NUM1 of the pulse signals PLS to be subjected to addition processing to "1" on the basis of this control signal CTL1 (FIG. 19G). Accordingly, for example, the addition controller CKT2 turns on the switch SWA, and turns off the switches SWB to SWD, and the adder 32 generates the pulse signal PLS1 having a waveform similar to that of the pulse signal PLSA.

In addition, in the photodetection unit U2, the light intensity determining section 36 determines that light intensity obtained on the basis of the count values CNTA to CNTD of the counters 35A to 35D is low, and changes the control signal CTL2 to the low level at the timing t43 (FIG. 19H). The addition controller CKT2 of the adder 32 sets the signal number NUM2 of the pulse signals PLS to be subjected to addition processing to "4", on the basis of this control signal CTL2 (FIG. 19I). Accordingly, the addition controller CKT2 turns on the switches SWA to SWD, and the adder 32 generates the pulse signal PLS1 on the basis of the pulse signals PLSA to PLSD.

Then, in a period from a timing t44 to a timing t45, the readout controller 23 performs the readout control CR, thereby controlling the operations of the plurality of photodetection units U to supply the signal processor 24 with the count values CNTA to CNTD generated by each of the plurality of photodetection units U. Thereafter, the count values CNTA to CNTD in the counters 35A to 35D are reset.

In a period (detection period PDET) from the timing t45 to a timing t46, similarly, the photodetection system 1D repeatedly emits the light pulse L0, and repeatedly detects the reflected light pulse L1 reflected by the detection object OBJ.

Then, after the timing t46, the light intensity determining section 36 determines light intensity on the basis of the count values CNTA to CNTD of the counters 35A to 35D. The addition controller CKT2 of the adder 32 then sets the signal number NUM of the pulse signals PLS to be subjected to addition processing of four pulse signals PLS (pulse signals PLSA to PLSD), on the basis of a result of such determination.

In this example, in the photodetection unit U1, the light intensity determining section 36 determines that the light intensity obtained on the basis of the count values CNTA to CNTD of the counters 35A to 35D is high, and changes the control signal CTL to the high level at a timing t47 (FIG. 19E). The addition controller CKT2 of the adder 32 sets the signal number NUM1 of the pulse signals PLS to be subjected to addition processing to "1", on the basis of this control signal CTL1 (FIG. 19G). Accordingly, for example, the addition controller CKT2 turns on the switch SWA, and turns off the switches SWB to SWD, and the adder 32 generates the pulse signal PLS1 having a waveform similar to that of the pulse signal PLSA.

In addition, in the photodetection unit U2, the light intensity determining section 36 determines that the light intensity obtained on the basis of the count values CNTA to CNTD of the counters 35A to 35D is high, and changes the control signal CTL2 to the low level at the timing t47 (FIG. 19H). The addition controller CKT2 of the adder 32 sets the signal number NUM2 of the pulse signals PLS to be subjected to addition processing to "1", on the basis of this control signal CTL2 (FIG. 19I). Accordingly, the addition controller CKT2 turns on the switch SWA, and turns off the switches SWB to SWD, and the adder 32 generates the pulse signal PLS1 having a waveform similar to that of the pulse signal PLSA.

Then, in a period from a timing t48 to a timing t49, the readout controller 23 performs the readout control CR, thereby controlling the operations of the plurality of photodetection units U to supply the signal processor 24D with the count values CNTA to CNTD generated by each of the plurality of photodetection units U. Thereafter, the count values CNTA to CNTD in the counters 35A to 35D are reset.

The signal processor 24D generates data of a distance image by measuring time from emission of the light pulse L0 by the light-emitting section 11 to detection of the reflected light pulse L1 by the photodetection unit U, on the basis of the count values CNTA to CNTD supplied from each of the plurality of photodetection units U, and outputs the generated data as the data DT.

Even such a configuration makes it possible to enhance detection accuracy in the distance measurement operation. In this example, in the photodetection system 1D that performs only the distance measurement operation, the signal number NUM is determined on the basis of the count values CNTA to CNTD in the distance measurement operation; however, in a photodetection system that is able to perform both the imaging operation and the distance measurement operation, the signal number NUM may be determined on the basis of the count values CNTA to CNTD in the distance measurement operation.

In this example, in the light-receiving sections 31A to 31D, for example, as illustrated in FIG. 4A, the inverter IV1 is provided, but this is not limitative. For example, the inverter IV1 may not be provided. The photodetection unit U according to the present modification example includes light-receiving sections 41A to 41D and an adder 42, as with the configuration illustrated in FIG. 18. The light-receiving section 41A includes the photodiode PD and the resistor R1, as illustrated in FIG. 20. The adder 42 includes the switches SWA, SWB, SWC, and SWD, a negative AND (NAND) circuit ND1, and the addition controller CKT2, as illustrated in FIG. 21. The NAND circuit ND1 is configured to generate the pulse signal PLS1 by finding NAND of four signals supplied from the switches SWA to SWD.

Modification Example 4

In the embodiment described above, as illustrated in FIGS. 4A and 4B, each of the light-receiving sections 31A to 31D includes one photodiode PD, but this is not limitative. Instead of this, for example, as illustrated in FIGS. 22A and 22B, each of the light-receiving sections 31A to 31D may include a plurality of photodiodes PD (four photodiodes PD1 to PD4 in this example). The photodiodes PD1 to PD4 are coupled in parallel to each other, and the photodiodes PD1 to PD4 each have an anode supplied with the power supply voltage VSS, and a cathode coupled to the node N1.

Modification Example 5

In the embodiment described above, the configuration of the counter 35 is fixed, but this is not limitative. Instead of this, for example, the configuration of the counter 35 may be changeable. The photodetection unit U according to the present modification example is described in detail below.

The photodetection unit U has a configuration similar to that of the photodetection unit U (FIG. 3) according to the embodiment described above. The photodetection unit U according to the present modification example further includes a plurality of switches, and changing these switches makes it possible to implement any of following various configurations. An equivalent circuit configuration implemented by changing switches is described below.

FIG. 23 illustrates an example of an equivalent circuit configuration in the imaging mode MA of the photodetection unit U according to the present modification example. In FIG. 23, the adder 32, the selectors 33A to 33D, the switches 34A to 34D, and the light intensity determining section 36 are not illustrated. In this example, the counter 35A includes a low-order counter 35A1 and a high-order counter 35A2. The counter 35B includes a low-order counter 35B1 and a high-order counter 35B2. The counter 35C includes a low-order counter 35C1 and a high-order counter 35C2. The counter 35D includes a low-order counter 35D1 and a high-order counter 35D2. For example, in a case where the counter 35A is an 8-bit counter, each of the counters 35A1 and 35A2 is a 4-bit counter. As with the embodiment described above, the counter 35A performs count processing on the basis of the pulse signal PLSA, the counter 35B performs count processing on the basis of the pulse signal PLSB, the counter 35C performs count processing on the basis of the pulse signal PLSC, and the counter 35D performs count processing on the basis of the pulse signal PLSD.

FIG. 24 illustrates an example of an equivalent circuit configuration in the distance measurement mode MB (distance measurement mode MB1) of the photodetection unit U according to the present modification example. In FIG. 24, the selectors 33A to 33D and the light intensity determining section 36 are not illustrated. In this example, as with the embodiment described above, the switches 34A to 34D divide the pulse signal PLS1 into four pulse signal in a time division manner on the basis of the clock signals CLKA to CLKD that configure a four-phase clock signal.

FIG. 25 illustrates an example of an equivalent circuit configuration in another distance measurement mode MB (distance measurement mode MB2) of the photodetection unit U according to the present modification example. In FIG. 25, the selectors 33A to 33D and the light intensity determining section 36 are not illustrated. In this example, four counters 35A, 35B, 35C, and 35D illustrated in FIGS. 23 and 24 are reconfigured into eight counters 35A1, 35A2, 35B1, 35B2, 35C1, 35C2, 35D1, and 35D2. The photodetection unit U includes switches 44A to 44H. The switch 44A is configured to turn on or off supply of the pulse signal PLS1 to the counter 35A1 on the basis of the clock signal CLKA. The switch 44B is configured to turn on or off supply of the pulse signal PLS1 to the counter 35A2 on the basis of the clock signal CLKB. The switch 44C is configured to turn on or off supply of the pulse signal PLS1 to the counter 35B1 on the basis of the clock signal CLKC. The switch 44D is configured to turn on or off supply of the pulse signal PLS1 to the counter 35B2 on the basis of the clock signal CLKD. The switch 44E is configured to turn on or off supply of the pulse signal PLS1 to the counter 35C1 on the basis of a clock signal CLKE. The switch 44F is configured to turn on or off supply of the pulse signal PLS1 to the counter 35C2 on the basis of a clock signal CLKF. The switch 44G is configured to turn on or off supply of the pulse signal PLS1 to the counter 35D1 on the basis of a clock signal CLKG. The switch 44H is configured to turn on or off supply of the pulse signal PLS1 to the counter 35D2 on the basis of a clock signal CLKH. In this example, the switches 44A to 44H divide the pulse signal PLS1 into eight pulse signals in a time division manner on the basis of the clock signals CLKA to CLKH that configure an eight-phase clock signal. Accordingly, for example, it is possible to enhance detection accuracy in the distance measurement operation to twice as high as detection accuracy in the distance measurement mode MB1 (FIG. 24), or to expand a distance range in which a distance is measurable to twice as large as a distance range in the distance measurement mode MB1 (FIG. 24).

FIG. 26 illustrates an example of an equivalent circuit configuration in another distance measurement mode MB (distance measurement mode MB3) of the photodetection unit U according to the present modification example. In FIG. 26, the selectors 33A to 33D and the light intensity determining section 36 are not illustrated. In this example, eight counters 35A1, 35A2, 35B1, 35B2, 35C1, 35C2, 35D1, and 35D2 illustrated in FIG. 25 are reconfigured into two counters 35AB and 35CD. In the counter 35AB, the counters 35A1, 35A2, 35B1, and 35B2 are coupled in order from low order to high order. In the counter 35CD, the counters 35C1, 35C2, 35D1, and 35D2 are coupled in order from low order to high order. The photodetection unit U includes switches 54A and 54B. The switch 54A is configured to turn on or off supply of the pulse signal PLS1 to the counter 35AB on the basis of the clock signal CLKA. The switch 54B is configured to turn on or off supply of the pulse signal PLS1 to the counter 35CD on the basis of the clock signal CLKB. In this example, the switches 54A and 54B divide the pulse signal PLS1 into two pulse signals in a time division manner on the basis of the clock signals CLKA and CLKB that configure a two-phase clock signal. Accordingly, for example, it is possible to expand a count range of each of the counters 35AB and 35CD to twice as large as a count range in the distance measurement mode MB1 (FIG. 24). Accordingly, for example, it is possible to increase the detection period PDET illustrated in FIGS. 10A, 10B, 10C, 10D, 10E, 10F, 10G, 10H, 10I, 10J, and 10K, and it is possible to reduce the number of times of the readout control CR.

Thus, in this example, the photodetection unit U according to the present modification example is operable in one imaging mode MA and three distance measurement modes MB1 to MB3. Accordingly, it is possible to select a suitable distance measurement mode MB in accordance with usage. It is to be noted that, in this example, three distance measurement modes MB1 to MB3 are provided, but this is not limitative. For example, one or two of these distance measurement modes MB may be omitted, or another distance measurement mode MB may be further provided.

Modification Example 6

In the embodiment described above, the light-receiving sections 31A to 31D having a circuit configuration illustrated in FIGS. 4A and 4B are provided, but this is not limitative. The present modification example is described in detail below.

FIG. 27 illustrates a configuration example of the light-receiving section 31A according to the present modification example. The light-receiving section 31A includes the photodiode PD, transistors MP1 to MP3 and MN4, inverters IV2 and IV3, a delay circuit DEL, a NAND circuit ND2, and an inverter IV4. The transistors MP1 to MP3 are P-type MOS transistors, and the transistor MN4 is an N-type MOS transistor.

The photodiode PD has the anode supplied with the power supply voltage VSS, and the cathode coupled to the node N1. The transistor MP1 has a gate coupled to an output terminal of the inverter IV4, a source supplied with the power supply voltage VDD, and a drain coupled to the node N1. The transistor MP2 has a gate coupled to an output terminal of the NAND circuit ND2, a source supplied with a power supply voltage VDD2, and a drain coupled to a source of the transistor MP3. The transistor MP3 has a gate coupled to the node N1, the source coupled to the drain of the transistor MP2, and a drain coupled to a node N2. The transistor MN4 has a gate coupled to the output terminal of the NAND circuit ND2, a drain coupled to the node N2, and a source grounded.

The inverter IV2 has an input terminal coupled to the node N2, and an output terminal coupled to an input terminal of the inverter IV3 and an input terminal of the delay circuit DEL. The inverter IV3 has the input terminal coupled to the output terminal of the inverter IV2, and an output terminal coupled to the selector 33A and the adder 32 (FIGS. 32A, 32B, 32C, and 32D) in a stage subsequent to this light-receiving section 31A.

The delay circuit DEL is configured to delay an inputted signal by a predetermined time and output the delayed signal. The delay circuit DEL has the input terminal coupled to the output terminal of the inverter IV2 and an output terminal coupled to the NAND circuit ND2. The NAND circuit ND2 is configured to find NAND of an output signal of the delay circuit DEL and a control signal XRST. The NAND circuit ND2 has a first input terminal coupled to the output terminal of the delay circuit DEL, a second input terminal supplied with the control signal XRST, and the output terminal coupled to the gates of the transistors MP2 and MN4 and an input terminal of the inverter IV4. The inverter IV4 has the input terminal could to the output terminal of the NAND circuit ND2, and the output terminal coupled to the gate of the transistor MP1.

Here, the transistor MP3 corresponds to a specific example of a "transistor" in the present disclosure. The transistor MP2 corresponds to a specific example of a "first switch" in the present disclosure. The transistor MN4 corresponds to a specific example of a "second switch" in the present disclosure. The inverter IV2, the delay circuit DEL, and the NAND circuit ND2 correspond to specific examples of a "control circuit" in the present disclosure.

FIGS. 28A, 28B, 28C, 28D, 28E, 28F, and 28G illustrate an operation example of the light-receiving section 31A. FIG. 28A indicates a waveform of incident light on the photodiode PD. FIG. 28B indicates a waveform of the control signal XRST. FIG. 28C indicates a waveform of a voltage V1 at the node N1. FIG. 28D indicates a waveform of a voltage V2 at the node N2. FIG. 28E indicates a waveform of a voltage V3 at the output terminal of the inverter IV2. FIG. 28F indicates a voltage V4 at the output terminal of the NAND circuit ND2. FIG. 28G indicates a waveform of the pulse signal PLSA.

At a timing t61, the signal generator 22E according to the present modification example changes the control signal XRST from the high level to the low level (FIG. 28B). On the basis of this change in the control signal XRST, the voltage V4 at the output terminal of the NAND circuit ND2 changes from the low level to the high level (FIG. 28E). on the basis of this change in the voltage V4, the voltage at the gate of the transistor MP1 changes from the high level to the low level, which turns on the transistor MP1 is turned on to set the voltage at the node N1 to the power supply voltage VDD (FIG. 28C). In addition, on the basis of this change in the voltage V4, the transistor MP2 is turned off and the transistor MN4 is turned on, which sets the voltage V2 at the node N2 to the low level (FIG. 28D), and sets the voltage V3 at the output terminal of the inverter IV2 to the high level (FIG. 28E).

Thereafter, the signal generator 22E then changes the control signal XRST from the low level to the high level (FIG. 28B). On the basis of this change in the control signal XRST, the voltage V4 at the output terminal of the NAND circuit ND2 changes from the high level to the low level (FIG. 28E). On the basis of this change in the voltage V4, the voltage at the gate of the transistor MP1 changes from the low level to the high level, which turns off the transistor MP1 and maintains the voltage at the node N1 at the power supply voltage VDD FIG. 28C). In addition, on the basis of this change in the voltage V4, the transistor MP2 is turned on and the transistor MN4 is turned off, which maintains the voltage V2 at the node N2 at the low level (FIG. 28D) and maintains the voltage V3 at the output terminal of the inverter IV2 at the high level (FIG. 28E).

At a timing t62, in a case where a photon enters the photodiode PD (FIG. 28A), avalanche amplification occurs, and the voltage V1 at the node N1 starts to decrease from the power supply voltage VDD (FIG. 28C). Then, on the basis of this change in the voltage V1, the transistor MP3 is turned from off to on, and the voltage V2 at the node N2 changes from the low level to the high level (FIG. 28D). on the basis of this change in the voltage V2, the voltage V3 at the output terminal of the inverter IV2 changes from the high level to the low level at a timing t63 (FIG. 28E). On the basis of this change in the voltage V3, the voltage of the pulse signal PLSA changes from the low level to the high level (FIG. 28G).

The delay circuit DEL delays a signal indicated by this voltage V3. Accordingly, the voltage V4 at the output terminal of the NAND circuit ND2 changes from the low level to the high level at a timing t64 (FIG. 28E). On the basis of this change in the voltage V4, the voltage at the gate of the transistor MP1 changes from the high level to the low level, which turns the transistor MP1 from off to on, and the cathode voltage V1 of the photodiode PD changes toward the power supply voltage VDD (FIG. 28C). In addition, on the basis of this change in the voltage V4, the transistor MP2 is turned from on to off, the transistor MN4 is turned from off to on, and the voltage V2 at the node N2 changes from the high level to the low level (FIG. 28D). on the basis of this change in the voltage V2, the voltage V3 at the output terminal of the inverter IV2 changes from the low level to the high level at a timing t65 (FIG. 28E). On the basis of this change in the voltage V3, the voltage of the pulse signal PLSA changes from the high level to the low level (FIG. 28G). The delay circuit DEL delays a signal indicated by this voltage V3. Accordingly, the voltage V4 at the output terminal of the NAND circuit ND2 changes from the high level to the low level at a timing t66 (FIG. 28F).

Thus, the light-receiving section 31A generates the pulse signal PLSA by detecting light. A pulse width Tpw of the pulse signal PLSA has a time width corresponding to the amount of delay in the delay circuit DEL. Accordingly, adjusting the amount of delay in the delay circuit DEL makes it possible to set the pulse width Tpw of the pulse signal PLSA to an appropriate time width.

Modification Example 7

In the embodiment described above, as illustrated in FIGS. 4A and 4B, the cathode of the photodiode PD is directly coupled to the drain of the transistor MP1 and the input terminal of the inverter IV1, but this is not limitative. The present modification example is described in detail below with reference to some examples.

FIG. 29 illustrates a configuration example of the light-receiving section 31A according to the present modification example. FIG. 29 illustrates that the present modification example is applied to the light-receiving section 31A illustrated in FIG. 4B. This light-receiving section 31A includes the photodiode PD, the transistor MP1, an inverter IV11, transistors MP11 and MP12, a resistor R11, the inverter IV1, and the control circuit CKT1. The transistors MP1, MP11, and MP12 are P-type MOS transistors.

The photodiode PD has the anode supplied with the power supply voltage VSS, and the cathode coupled to a node N11. The inverter IV11 has an input terminal supplied with the mode control signal SMODE, and an output terminal coupled to a gate of the transistor MP12. The transistor MP11 has a gate supplied with the mode control signal SMODE, a source coupled to the node N1, and a drain coupled to one end of the resistor R11. The resistor R11 has the one end coupled to the drain of the transistor MP11, and another end coupled to the node N11. The transistor MP12 has the gate coupled to the output terminal of the inverter IV11, a source coupled to the node N1, and a drain coupled to the node N11. It is desirable that the sum of an on-resistance value of the transistor MP12 and a resistance value of the resistor R11 be larger than a resistance value between the anode and cathode of the photodiode PD.

With this configuration, in a case where the operation mode M is the imaging mode MA, in the light-receiving section 31A, the transistor MP11 is turned on, and the transistor MP12 is turned off. Accordingly, the cathode of the photodiode PD is coupled to the drain of the transistor MP1 and the input terminal of the inverter IV1 through the transistor MP11 and the resistor R11. In addition, in a case where the operation mode M is the distance measurement mode MB, the transistor MP12 is turned on, and the transistor MP11 is turned off. Accordingly, the cathode of the photodiode PD is coupled to the drain of the transistor MP1 and the input terminal of the inverter IV1 through the transistor MP12.

Here, the transistor MP1 corresponds to a specific example of a "load element" in the present disclosure. The transistors MP11 and MP12 and the resistor R11 correspond to specific examples of a "variable resistor" in the present disclosure. The inverter IV1 corresponds to a specific example of a "generator" in the present disclosure.

FIGS. 30A, 30B, 30C, and 30D illustrate an operation example of the light-receiving section 31A in the imaging mode MA. FIG. 30A indicates a waveform of incident light on the photodiode PD. FIG. 30B indicates a waveform of the voltage V1 at the node N1. FIG. 30C indicates a waveform of a voltage V11 at the node N11. FIG. 30D indicates a waveform of the pulse signal PLSA.

FIG. 31 illustrates a configuration example of the light-receiving section 31A in the imaging mode MA. In FIG. 31, the transistors MP11 and MP12 each are illustrated with use of an illustration of a switch indicating its state. In addition, FIG. 31 illustrates a capacitor CAP1 indicating a parasitic capacitance value at the node N1 and a capacitor CAP11 corresponding to a parasitic capacitance value at the node N2. In the imaging mode MA, as illustrated in FIG. 31, the transistor MP11 is on, and the transistor MP12 is off.

At a timing t71, in a case where a photon enters the photodiode PD (FIG. 30A), avalanche amplification occurs, and a current flows from the cathode to the anode of the photodiode PD. In this case, the current flows from the capacitor CAP11 to the photodiode PD and the current flows from the capacitor CAP1 to the photodiode PD through the resistor R11, and the voltage V11 at the node N11 and the voltage V1 at the node N1 start to decrease from the power supply voltage VDD (FIGS. 30B and 30C). The capacitor CAP11 is directly coupled to the photodiode PD, and the resistor R11 is coupled between the capacitor CAP1 and the photodiode PD; therefore, an amount of decrease in the voltage at the node N1 is smaller than an amount of decrease in the voltage at the node N11.

Then, at a timing t72, in a case where the avalanche amplification ends, a current flows from the capacitor CAP1 to the capacitor CAP11, and redistribution of electric charge on the capacitors CAP1 and CAP11 is performed. Accordingly, the voltage V11 starts to increase, and the voltage V1 continues to decrease ((B) and (C) of FIGS. 30B and 30C).

At a timing t73, in a case where the voltage V1 becomes lower than the logical threshold of the inverter IV1, the pulse signal PLSA changes from the low level to the high level (FIG. 30D).

Then, at a timing t74, in a case where the redistribution of electric charge on the capacitors CAP1 and CAP11 ends, the voltages V1 and V11 becomes the same as each other, and these voltages are maintained.

Thereafter, at a timing t75, the control circuit CKT1 changes the voltage at the gate of the transistor MP1 from the high level to the low level. Accordingly, the transistor MP1 is turned on, and the voltages V1 and V11 change toward the power supply voltage VDD (FIGS. 30B and 30C). The pulse signal PLSA changes from the high level to the low level in accordance with this change in the voltage V1 (FIG. 30D).

Thus, in the imaging mode MA, the voltage V1 does not change greatly, which suppresses charge and discharge of the capacitor CAP1. As a result, in the photodetection system, it is possible to reduce electric power consumption in the imaging mode MA.

FIGS. 32A, 32B, 32C, and 32D illustrate an operation example of the light-receiving section 31A in the distance measurement mode MB. FIG. 32A indicates a waveform of incident light on the photodiode PD. FIG. 32B indicates a waveform of the voltage V1 at the node N1. FIG. 32C indicates a waveform of the voltage V11 at the node N11. FIG. 32D indicates a waveform of the pulse signal PLSA.

FIG. 33 illustrates a configuration example of the light-receiving section 31A in the distance measurement mode MB. In the distance measurement mode MB, as illustrated in FIG. 33, the transistor MP12 is on, and the transistor MP11 is off.

At a timing t81, in a case where a photon enters the photodiode PD ((A) of FIG. 32A), avalanche amplification occurs, and a current flows from the cathode to the anode of the photodiode PD. In this case, the current flows from the capacitor CAP11 to the photodiode PD and the current flows from the capacitor CAP1 to the photodiode PD through the resistor R11, and the voltage V11 at the node N11 and the voltage V1 at the node N1 start to decrease from the power supply voltage VDD (FIGS. 32B and 32C). In the distance measurement mode MB, the capacitor CAP1 is coupled to the photodiode PD through the transistor MP12; therefore, an amount of decrease in the voltage at the node N1 is substantially the same as an amount of decrease in the voltage at the node N11.

At a timing t82, in a case where the voltage V1 becomes lower than the logical threshold of the inverter IV1, the pulse signal PLSA changes from the low level to the high level (FIG. 32D).

Then, at a timing t82, in a case where avalanche amplification ends, the voltages V1 and V11 are almost maintained (FIGS. 32B and 32C).

Thereafter, at a timing t84, the control circuit CKT1 changes the voltage at the gate of the transistor MP1 from the high level to the low level. Accordingly, the transistor MP1 is turned on, and the voltages V1 and V11 change toward the power supply voltage VDD (FIGS. 32B and 32C). The pulse signal PLSA changes from the high level to the low level in accordance with this change in the voltage V1 (FIG. 32D).

Thus, in the distance measurement mode MB, it is possible to rise the pulse signal PLSA after a lapse of a short response time from a timing of entry of the photon. As a result, in the photodetection system, it is possible to enhance detection accuracy in the distance measurement operation.

FIG. 34 illustrates a configuration example of another light-receiving section 31A according to the present modification example. This light-receiving section 31A includes transistors MP21 and MP22. The transistors MP21 and MP22 are P-type MOS transistors. The transistor MP21 has a gate supplied with the mode control signal SMODE, a source coupled to the node N1, and a drain coupled to the node N11. The transistor MP22 has a gate coupled to the output terminal of the inverter IV11, a source coupled to the node N1, and a drain coupled to the node N11. A gate width $W_{P21}$ and a gate length $L_{P21}$ of the transistor MP21 and a gate width $W_{P22}$ a gate length $L_{P22}$ of the transistor MP22 satisfy the following expression.

$$W_{P21}/L_{P21}<W_{P22}/L_{P22}$$

Accordingly, it is possible to cause a drain-source resistance value of the transistor MP21 in a case where the transistor MP21 is on to be larger than a drain-source resistance value of the transistor MP22 in a case where the transistor MP22 is on.

FIG. 35 illustrates a configuration example of another light-receiving section 31A according to the present modification example. This light-receiving section 31A includes transistors MN11 and MN12, the resistor R11, and an inverter IV12. The transistors MN11 and MN12 are N-type MOS transistors. The transistor MN11 has a gate coupled to an output terminal of the inverter IV12, a drain coupled to the node N1, and a source coupled to one end of the resistor R11. The transistor MN12 has a gate supplied with the mode control signal SMODE, a drain coupled to the node N1, and a source coupled to the node N11. The inverter IV12 has an input terminal supplied with the mode control signal SMODE, and the output terminal coupled to the gate of the transistor MN11.

With this configuration, in a case where the operation mode M is the imaging mode MA, in the light-receiving section 31A, the transistor MN11 is turned on, and the transistor MN12 is turned off. Accordingly, the cathode of the photodiode PD is coupled to the drain of the transistor MP1 and the input terminal of the inverter IV1 through the transistor MN11 and the resistor R11. In addition, in a case where the operation mode M is the distance measurement mode MB, the transistor MN12 is turned on, and the transistor MN11 is turned off. Accordingly, the cathode of the photodiode PD is coupled to the drain of the transistor MP1 and the input terminal of the inverter IV1 through the transistor MN12.

FIG. 36 illustrates a configuration example of another light-receiving section 31A according to the present modification example. This light-receiving section 31A includes transistors MN21 and MN22. The transistors MN21 and MN22 are N-type MOS transistors. The transistor MN21 has a gate coupled to the output terminal of the inverter IV12, a drain coupled to the node N1, and a source coupled to the node N11. The transistor MN22 has a gate supplied with the mode control signal SMODE, a drain coupled to the node N1, and a source coupled to the node N11. A gate width $W_{N21}$ and a gate length $L_{N21}$ of the transistor MN21 and a gate width $W_{N22}$ and a gate length $L_{N22}$ of the transistor MN22 satisfy the following expression.

$$W_{N21}/L_{N21}<W_{N22}/L_{N22}$$

Accordingly, it is possible to cause a drain-source resistance value of the transistor MN21 in a case where the transistor MN21 is on to be larger than a drain-source resistance value of the transistor MN22 in a case where the transistor MN22 is on.

Other Modification Examples

Two or more of these modification examples may be combined.

2. Example of Application to Mobile Body

The technology (the present technology) according to the present disclosure is applicable to a variety of products. For example, the technology according to the present disclosure may be achieved as a device mounted on any type of mobile body such as an automobile, an electric vehicle, a hybrid electric vehicle, a motorcycle, a bicycle, a personal mobility, an airplane, a drone, a vessel, or a robot.

FIG. 37 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 37, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 37, an audio speaker 12061, a display section 12062, and an instrument panel 12063 are illustrated as the output device. The display section 12062 may, for example, include at least one of an on-board display and a head-up display.

FIG. 38 is a diagram depicting an example of the installation position of the imaging section 12031.

In FIG. 38, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 38 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The example of the vehicle control system to which the technology according to the present disclosure may be applied has been described above. The technology according to the present disclosure may be applied to the imaging section 12031 among the components described above. This makes it possible to enhance detection accuracy in the distance measurement operation in the vehicle control system 12000. This allows the vehicle control system 12000 to implement, with high accuracy, collision avoidance or shock mitigation for vehicles, a following driving function based on vehicle-to-vehicle distance, a vehicle speed maintaining driving function, a warning function of collision of the vehicle, a warning function of deviation of the vehicle from a lane, and the like.

Although the present technology has been described above with reference to some embodiments, the modification examples, and specific application examples thereof, the present technology is not limited to these embodiments and the like, and may be modified in a variety of ways.

For example, in each embodiment described above, four light-receiving sections 31 and four selectors 33 are provided, but this is not limitative. Instead of this, for example, N1 light-receiving sections 31 and N1 selectors 33 may be provided. N1 is three or less or five or more. In addition, in each embodiment described above, four switches 34 and four counters 35 are provided, but this is not limitative. Instead of this, for example, N2 switches 34 and N2 counters 35 may be provided. N2 is three or less or five or more. N1 and N2 may be equal to each other as illustrated in FIG. 24, or may not be equal to each other as illustrated in FIGS. 25 and 26.

It is to be noted that the effects described herein are merely illustrative and non-limiting, and other effects may be included.

It is to be noted that the present technology may have the following configurations. According to the present technology having the following configurations, it is possible to enhance detection accuracy.

(1)

A photodetection device including:

a plurality of light-receiving sections that each includes a light-receiving element, and generates a first pulse signal including a pulse corresponding to a result of light reception by the light-receiving element;

an adder that generates a second pulse signal by selecting one or more first pulse signals from a plurality of the first pulse signals generated by the plurality of light-receiving sections and performing addition processing on the basis of the one or more selected first pulse signals;

a divider that performs division processing for dividing the second pulse signal into a plurality of third pulse signals in a time division manner on the basis of a clock signal;

a plurality of counters that is provided corresponding to the plurality of third pulse signals, and each performs count processing on the basis of a corresponding one of the third pulse signals; and a controller that sets signal number of the one or more pulse signals to be subjected to the addition processing on the basis of respective count values of the plurality of counters.

(2)

The photodetection device according to (1), in which the controller determines light intensity on the basis of the respective count values of the plurality of counters, in a case where the light intensity is first light intensity, the controller sets the signal number to a first number, and in a case where the light intensity is second light intensity that is lower than the first light intensity, the controller sets the signal number to a second number that is larger than the first number.

(3)

The photodetection device according to (2), in which the controller determines the light intensity on the basis of whether or not a total count value of a plurality of count values of the plurality of counters reaches a predetermined count value.

(4)

The photodetection device according to (2), in which the controller determines the light intensity on the basis of whether or not one or more of a plurality of count values of the plurality of counters reach a predetermined count value.

(5)

The photodetection device according to any one of (1) to (3), in which the photodetection device has a first operation mode and a second operation mode, and in the first operation mode, the adder generates the second pulse signal by performing the addition processing, and each of the plurality of counters performs the count processing on the basis of a corresponding one of the third pulse signals.

(6)

The photodetection device according to (5), in which number of the plurality of counters is the same as number of the plurality of light-receiving sections, the plurality of counters correspond one by one to the plurality of first pulse signals, and in the second operation mode, each of the plurality of counters performs the count processing on the basis of a corresponding one of the first pulse signals.

(7)

The photodetection device according to (6), in which the controller sets the signal number on the basis of respective count values of the plurality of counters in the second operation mode.

(8)

The photodetection device according to (5), in which number of the plurality of counters is different from number of the plurality of light-receiving sections, the plurality of counters is reconfigured into two or more counters that are same in number as the plurality of light-receiving sections, the two or more counters correspond one by one to the plurality of first pulse signals, and in the second operation mode, each of the two or more counters performs the count processing on the basis of a corresponding one of the first pulse signals.

(9)

The photodetection device according to (8), in which the controller sets the signal number on the basis of respective count values of the two or more counters in the second operation mode.

(10)

The photodetection device according to any one of (5) to (9), in which the light-receiving element is provided in a first path between a first node and a first power supply node, and each of the plurality of light-receiving sections includes a load element provided in a second path between the first node and a second power supply node, a variable resistor provided between the first node and the light-receiving element in the first path, and a generator that generates the first pulse signal on the basis of a voltage at the first node.

(11)

The photodetection device according to (10), in which the variable resistor is configured to set a resistance value to a first resistance value or a second resistance value that is larger than the first resistance value, in the first operation mode, the variable resistor sets the resistance value to the first resistance value, and in the second operation mode, the variable resistor sets the resistance value to the second resistance value.

(12)

The photodetection device according to any one of (1) to (11), in which each of the plurality of light-receiving sections includes a transistor having a gate coupled to the light-receiving element, a source, and a drain, a first switch that supplies a first power supply voltage to the source of the transistor by being turned on, a second switch that supplies a second power supply voltage to the drain of the transistor by being turned on, and a control circuit that turns on one of the first switch and the second switch and turns off another one of the first switch and the second switch after a lapse of a predetermined time from change in a voltage at the drain, on the basis of the voltage at the drain of the transistor.

(13)

The photodetection device according to any one of (1) to (12), in which the light-receiving element includes an avalanche photodiode.

(14)

The photodetection device according to any one of (1) to (13), in which the light-receiving element includes a single photon avalanche diode.

(15)

The photodetection device according to any one of (1) to (14), in which a plurality of photodetection units is provided, and each of the plurality of photodetection units includes the plurality of light-receiving sections, the adder, the divider, the plurality of counters, and the controller.

(16)

The photodetection device according to any one of (1) to (15), in which a plurality of the light-receiving elements is provided on a first semiconductor substrate, and the adder, the divider, and the plurality of counters are provided on a second semiconductor substrate bonded to the first semiconductor substrate.

(17)

A photodetection system including:

a light-emitting section that emits light; and a photodetector that detects light reflected by a detection object of the light emitted from the light-emitting section, in which the photodetector includes a plurality of light-receiving sections that each includes a light-receiving element, and generates a first pulse signal including a pulse corresponding to a result of light reception by the light-receiving element, an adder that generates a second pulse signal by selecting one or more first pulse signals from a plurality of the first pulse signals generated by the plurality of light-receiving sections and performing addition processing on the basis of the one or more selected first pulse signals, a divider that performs division processing for dividing the second pulse signal into a plurality of third pulse signals in a time division manner on the basis of a clock signal, a plurality of counters that is provided corresponding to the plurality of third pulse signals, and each performs count processing on the basis of a corresponding one of the third pulse signals, and a controller that sets signal number of the one or more pulse signals to be subjected to the addition processing on the basis of respective count values of the plurality of counters.

This application claims the priority on the basis of Japanese Patent Application No. 2020-183865 filed on Nov. 2, 2020 with Japan Patent Office, the entire contents of which are incorporated in this application by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A photodetection device comprising:

a plurality of light-receiving sections that each includes a light-receiving element, and generates a first pulse signal including a pulse corresponding to a result of light reception by the light-receiving element;

an adder that generates a second pulse signal by selecting one or more first pulse signals from a plurality of first pulse signals generated by the plurality of light-receiving sections and performing addition processing on a basis of the one or more selected first pulse signals;

a divider that performs division processing for dividing the second pulse signal into a plurality of third pulse signals in a time division manner on a basis of a clock signal;

a plurality of counters that is provided corresponding to the plurality of third pulse signals, and each performs count processing on a basis of a corresponding one of the plurality of third pulse signals; and a controller that sets a signal number of the one or more first pulse signals to be subjected to the addition processing on a basis of respective count values of the plurality of counters.

2. The photodetection device according to claim 1, wherein the controller determines light intensity on a basis of the respective count values of the plurality of counters, in a case where the light intensity is first light intensity, the controller sets the signal number to a first number, and in a case where the light intensity is second light intensity that is lower than the first light intensity, the controller sets the signal number to a second number that is larger than the first number.

3. The photodetection device according to claim 2, wherein the controller determines the light intensity on a basis of whether or not a total count value of a plurality of count values of the plurality of counters reaches a predetermined count value.

4. The photodetection device according to claim 2, wherein the controller determines the light intensity on a basis of whether or not one or more of a plurality of count values of the plurality of counters reach a predetermined count value.

5. The photodetection device according to claim 1, wherein the photodetection device has a first operation mode and a second operation mode, and in the first operation mode, the adder generates the second pulse signal by performing the addition processing, and each of the plurality of counters performs the count processing on the basis of the corresponding one of the plurality of third pulse signals.

6. The photodetection device according to claim 5, wherein a number of the plurality of counters is the same as a number of the plurality of light-receiving sections, the plurality of counters correspond one by one to the plurality of first pulse signals, and in the second operation mode, each of the plurality of counters performs the count processing on a basis of a corresponding one of the plurality of first pulse signals.

7. The photodetection device according to claim 6, wherein the controller sets the signal number on a basis of the respective count values of the plurality of counters in the second operation mode.

8. The photodetection device according to claim 5, wherein a number of the plurality of counters is different from a number of the plurality of light-receiving sections, the plurality of counters is reconfigured into two or more counters that are same in number as the plurality of light-receiving sections, the two or more counters correspond one by one to the plurality of first pulse signals, and in the second operation mode, each of the two or more counters performs the count processing on a basis of a corresponding one of the plurality of first pulse signals.

9. The photodetection device according to claim 8, wherein the controller sets the signal number on a basis of respective count values of the two or more counters in the second operation mode.

10. The photodetection device according to claim 5, wherein the light-receiving element is provided in a first path between a first node and a first power supply node, and each of the plurality of light-receiving sections includes a load element provided in a second path between the first node and a second power supply node, a variable resistor provided between the first node and the light-receiving element in the first path, and a generator that generates the first pulse signal on a basis of a voltage at the first node.

11. The photodetection device according to claim 10, wherein the variable resistor is configured to set a resistance value to a first resistance value or a second resistance value that is larger than the first resistance value, in the first operation mode, the variable resistor sets the resistance value to the first resistance value, and in the second operation mode, the variable resistor sets the resistance value to the second resistance value.

12. The photodetection device according to claim 1, wherein each of the plurality of light-receiving sections includes a transistor having a gate coupled to the light-receiving element, a source, and a drain, a first switch that supplies a first power supply voltage to the source of the transistor by being turned on, a second switch that supplies a second power supply voltage to the drain of the transistor by being turned on, and a control circuit that turns on one of the first switch and the second switch and turns off another one of the first switch and the second switch after a lapse of a predetermined time from change in a voltage at the drain, on a basis of the voltage at the drain of the transistor.

13. The photodetection device according to claim 1, wherein the light-receiving element includes an avalanche photodiode.

14. The photodetection device according to claim 1, wherein the light-receiving element includes a single photon avalanche diode.

15. The photodetection device according to claim 1, wherein a plurality of photodetection units is provided, and each of the plurality of photodetection units includes the plurality of light-receiving sections, the adder, the divider, the plurality of counters, and the controller.

16. The photodetection device according to claim 1, wherein a plurality of light-receiving elements is provided on a first semiconductor substrate, and the adder, the divider, and the plurality of counters are provided on a second semiconductor substrate bonded to the first semiconductor substrate.

17. A photodetection system, comprising:

a light-emitting section that emits light; and a photodetector that detects light reflected by a detection object of the light emitted from the light-emitting section, wherein the photodetector includes a plurality of light-receiving sections that each includes a light-receiving element, and generates a first pulse signal including a pulse corresponding to a result of light reception by the light-receiving element, an adder that generates a second pulse signal by selecting one or more first pulse signals from a plurality of first pulse signals generated by the plurality of light-receiving sections and performing addition processing on a basis of the one or more selected first pulse signals, a divider that performs division processing for dividing the second pulse signal into a plurality of third pulse signals in a time division manner on a basis of a clock signal, a plurality of counters that is provided corresponding to the plurality of third pulse signals, and each performs count processing on a basis of a corresponding one of the third pulse signals, and a controller that sets a signal number of the one or more first pulse signals to be subjected to the addition processing on a basis of respective count values of the plurality of counters.

* * * * *